(12) United States Patent
Balakrishnan et al.

(10) Patent No.: US 11,392,327 B2
(45) Date of Patent: Jul. 19, 2022

(54) LOCAL DATA COMPACTION FOR INTEGRATED MEMORY ASSEMBLY

(71) Applicant: WESTERN DIGITAL TECHNOLOGIES, INC., San Jose, CA (US)

(72) Inventors: Rakesh Balakrishnan, Bangalore (IN); Eldhose Peter, Bangalore (IN); Akhilesh Yadav, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/177,310

(22) Filed: Feb. 17, 2021

(65) Prior Publication Data

US 2022/0075559 A1    Mar. 10, 2022

Related U.S. Application Data

(60) Provisional application No. 63/076,175, filed on Sep. 9, 2020.

(51) Int. Cl.

| | |
|---|---|
| *G06F 3/06* | (2006.01) |
| *G06F 11/10* | (2006.01) |
| *G06F 13/40* | (2006.01) |
| *H01L 25/18* | (2006.01) |
| *G11C 16/26* | (2006.01) |
| *G11C 16/10* | (2006.01) |
| *G06F 13/16* | (2006.01) |
| *G11C 16/04* | (2006.01) |

(52) U.S. Cl.
CPC .......... *G06F 3/0659* (2013.01); *G06F 3/0608* (2013.01); *G06F 3/0679* (2013.01); *G06F 11/1076* (2013.01); *G06F 13/1668* (2013.01); *G06F 13/4027* (2013.01); *G11C 16/10* (2013.01); *G11C 16/26* (2013.01); *H01L 25/18* (2013.01); *G11C 16/0483* (2013.01)

(58) Field of Classification Search
CPC .... G06F 3/0659; G06F 3/0608; G06F 3/0679; G06F 11/1076; G06F 13/1668; G06F 13/4027; G11C 16/10; G11C 16/26; G11C 16/0483; G11C 16/08; G11C 5/025; G11C 7/1006; H01L 25/18
USPC ........................................................ 711/103
See application file for complete search history.

(56) References Cited

U.S. PATENT DOCUMENTS

| | | |
|---|---|---|
| 5,838,832 A | 11/1998 | Barnsley |
| 7,226,026 B2 | 9/2007 | Gongwer |
| 7,409,473 B2 | 8/2008 | Conley |
| 7,446,575 B2 | 12/2008 | Shalvi |
| 7,849,381 B2 | 12/2010 | Tomlin |
| 8,111,548 B2 | 2/2012 | Mokhlesi |
| 8,144,512 B2 | 3/2012 | Huang |
| 8,301,912 B2 | 10/2012 | Lin |
| 8,341,501 B2 | 12/2012 | Franceschini |

(Continued)

*Primary Examiner* — Fernando Hidalgo
(74) *Attorney, Agent, or Firm* — Vierra Magen Marcus LLP

(57) ABSTRACT

An integrated memory assembly comprises a memory die and a control die bonded to the memory die. The memory die includes a memory structure of non-volatile memory cells. The control die is configured to program user data to and read user data from the memory die in response to commands from a memory controller. To utilize space more efficiently on the memory die, the control die compacts fragmented data on the memory die.

15 Claims, 24 Drawing Sheets

(56) References Cited

U.S. PATENT DOCUMENTS

| | | |
|---|---|---|
| 8,626,987 B2 | 1/2014 | Jung |
| 8,756,365 B2 | 6/2014 | Sharon |
| 8,799,559 B2 | 8/2014 | Sharon |
| 8,874,994 B2 | 10/2014 | Sharon |
| 9,021,187 B2 | 4/2015 | Sela |
| 9,165,649 B2 | 10/2015 | Sharon |
| 9,575,683 B2 | 2/2017 | Achtenberg |
| 9,652,382 B1 | 5/2017 | Subramanian |
| 10,162,748 B2 | 12/2018 | Kotte |
| 10,387,303 B2 | 8/2019 | Mehra |
| 10,459,644 B2 | 10/2019 | Mehra |
| 10,565,123 B2 | 2/2020 | Song |
| 11,158,622 B1* | 10/2021 | Zhang ................ H01L 25/0657 |
| 2013/0103891 A1 | 4/2013 | Sharon |
| 2014/0136761 A1 | 5/2014 | Li |
| 2016/0232088 A1 | 8/2016 | Mohan |
| 2017/0148510 A1 | 5/2017 | Bazarsky |
| 2018/0260317 A1 | 9/2018 | Chu |
| 2019/0179568 A1 | 6/2019 | Hsu |
| 2019/0272229 A1 | 9/2019 | Halumi |
| 2019/0341375 A1 | 11/2019 | Hirano |
| 2020/0089414 A1* | 3/2020 | Kojima ................ G06F 3/0656 |
| 2021/0191882 A1* | 6/2021 | Lee ........................ G06F 21/79 |
| 2021/0193637 A1* | 6/2021 | Jeng ................... H01L 23/5384 |
| 2021/0232543 A1* | 7/2021 | Cooper ................ G06F 21/606 |
| 2021/0255777 A1* | 8/2021 | Viraraghavan ....... G06F 3/0659 |
| 2021/0263795 A1* | 8/2021 | Li ....................... G06F 11/1076 |
| 2021/0334040 A1* | 10/2021 | Borich ................... G06F 3/067 |

\* cited by examiner

Sparse parity check matrix H

N=33 variable nodes

|     | v1 | v2 | v3 | v4 | v5 | v6 | v7 | v8 | v9 | v10 | v13 | v12 | v13 |
|-----|----|----|----|----|----|----|----|----|----|----|----|----|----|
| cn1 |    | 1  |    | 1  |    |    |    |    |    |    | 1  |    | 1  |
| cn2 | 1  |    |    |    |    | 1  |    |    |    |    | 1  |    |    |
| cn3 |    |    | 1  |    | 1  | 1  |    |    | 1  | 1  |    |    |    |
| cn4 |    | 1  |    |    |    |    | 1  |    | 1  |    |    |    |    |
| cn5 |    |    |    | 1  |    | 1  |    |    |    |    | 1  |    |    |
| cn6 | 1  |    |    | 1  | 1  |    | 1  |    |    |    |    |    |    |
| cn7 |    | 1  |    |    |    |    | 1  |    | 1  |    |    |    | 1  |
| cn8 |    |    |    | 1  |    | 1  |    |    |    |    | 1  | 1  |    |
| cn9 | 1  |    | 1  | 1  |    |    |    |    |    |    |    |    | 1  |
| cn10|    |    |    |    |    |    | 1  | 1  | 1  | 1  |    |    |    |

M=10 check nodes

Sparse bipartite graph, 392

LOCAL DATA COMPACTION FOR INTEGRATED MEMORY ASSEMBLY

This application claims the benefit of U.S. Provisional Patent Application No. 63/076,175, "LOCAL DATA COMPACTION FOR INTEGRATED MEMORY ASSEMBLY," filed on Sep. 9, 2020, which is hereby incorporated by reference in its entirety.

BACKGROUND

The strong growth in demand for portable consumer electronic devices is driving the need for high-capacity storage devices. Non-volatile semiconductor storage devices, such as flash memory, are widely used to meet the ever-growing demands on digital information storage and exchange. Their portability, versatility and rugged design, along with their high reliability and large capacity, have made such storage devices ideal for use in a wide variety of electronic devices, including for example, digital cameras, digital music players, video game consoles, PDAs, cellular telephones, personal computers and servers.

Non-volatile semiconductor storage devices typically include one or more memory die. Each memory die includes a memory array that stores data. In some examples of flash memory, the memory array is divided into blocks of memory cells and the data stored in the memory can only be erased at the block level (e.g., an entire block at a time). As data is overwritten or deleted, the memory system may mark that overwritten or deleted data as invalid or stale. Over time, a block of memory cells may become fragmented such that groups of valid data may be separated by invalid data (e.g., data that was rewritten somewhere else, deleted, etc.). This results in inefficient use of space in the memory array. As the amount of data stored in the memory approaches the capacity of the memory, the space wasted for the invalid data between fragments of valid data needs to be reclaimed.

DETAILED DESCRIPTION

To address the inefficient use of space in the memory array due to fragmented data, a compaction process can be used to compact the valid data and re-write the compacted valid data to a different location, thereby, freeing up the source location to be reclaimed for another use.

A storage system typically includes a controller and one or more memory dies separated by a communication interface. If the memory controller performs the data compaction process, then the data must be read from the memory, transferred to the memory controller, compacted, transferred back to the memory and then re-programmed in the memory. This process can be slow and utilize extra power due to transferring the data twice between the memory controller and the memory. Therefore, it is proposed to implement the memory as multiple dies, including a memory die and a control die. The memory die will include the memory array. The control die includes one or more control circuits (e.g., including one or more processors) that can operate the memory die. If the control die performs the data compaction process, then time and power are saved from not transferring the data twice between the memory controller and the memory.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements such as memory cells. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuits on the control die have transistors that are a different size (e.g., smaller) than memory cell transistors on the memory die. The different (e.g., smaller) size of the transistors on the control die may improve performance of the control circuits on the control die. For example, smaller transistors may use less power than larger transistors. Also, using smaller transistors allows one embodiment of a control die to have more transistors for control circuits on the control die.

Figure 1:
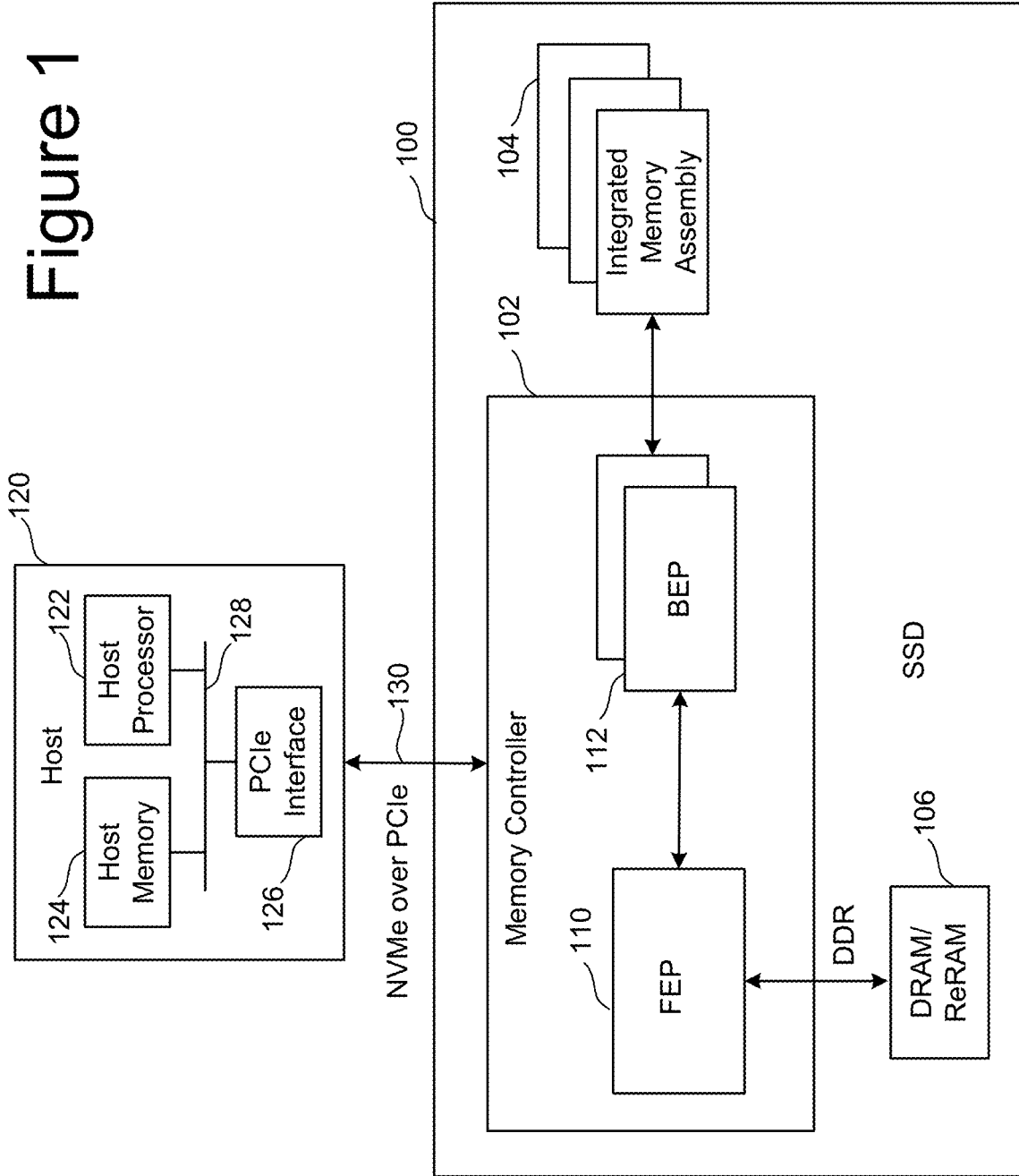
FIG. 1 is a block diagram of one embodiment of a memory system connected to a host.

FIGS. 1-5 describe one example of a memory system that can be used to implement the technology disclosed herein for compacting data. FIG. 1 is a block diagram of one embodiment of a memory system 100 connected to a host 120. Memory system (e.g., non-volatile memory system) 100 can implement the technology disclosed herein. Many different types of memory systems can be used with the technology disclosed herein. One example memory system is a solid state drive ("SSD"); however, other types of memory systems can also be used including removable memory cards and USB memory devices. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. Ion one embodiment, the ASICs for each of the BEP circuits 112 and the FEP circuit 110 are implemented on the same semiconductor such that memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, there are a plurality of integrated memory assemblies 104. In an embodiment, each integrated memory assembly 104 includes one or more memory die and one or more control die. Each memory die may include one or more memory structures. A control die may control operations on a memory die. For example, a control die may control and perform read, write, and erase operations on a memory die. In one embodiment, memory controller 102 communicates with a control die in order to instruct the control die to perform read, write, or erase operations on one or more non-volatile memory die or one or more memory structures. In one embodiment, each memory die in the integrated memory assembly 104 utilizes NAND flash memory (including two dimensional NAND flash memory and/or three dimensional NAND flash memory). In other embodiments, the integrated memory assembly 104 can include other types of memory; for example, PCM memory and MRAM.

Memory controller 102 communicates with host 120 by way of an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
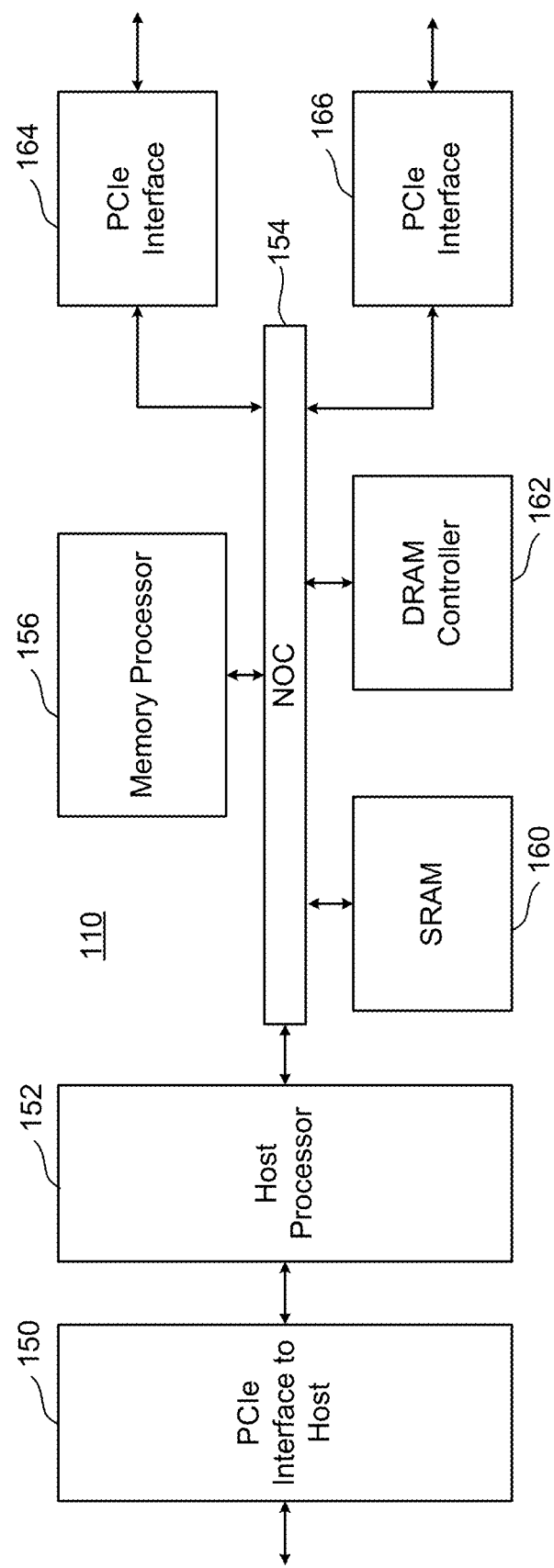
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
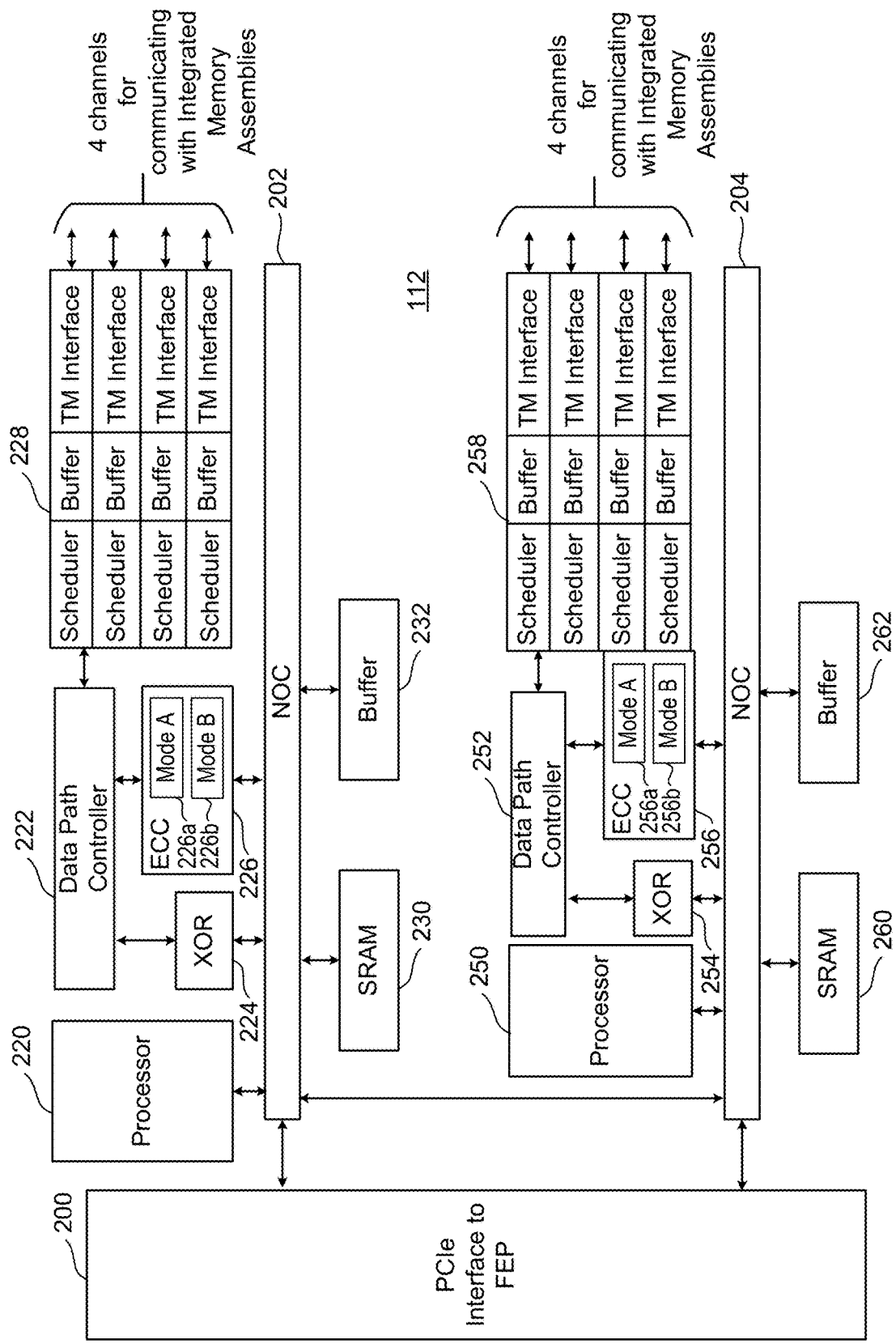
FIG. 3 is a block diagram of one embodiment of a Back End Processor Circuit.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256). The ECC engines 226/256 are used to perform error correction, as known in the art. Herein, the ECC engines 226/256 may be referred to as controller ECC engines.

The ECC engines 226/256 may encode data bytes received from the host, and may decode and error correct the data bytes read from the control die 304. In some embodiments, the ECC engines 226/256 calculate parity bits for each unit of data (e.g., page) that is being stored at one time. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

In some embodiments, memory controller 102 does not send the entire codeword to an integrated memory assembly 104. Instead, memory controller 102 sends only the data bits, with a control die on the integrated memory assembly 104 generating the parity bits. Optionally, memory controller 102 could send the entire codeword. In some cases, a control die of the integrated memory assembly 104 does not send an entire codeword to memory controller 102. Instead, the control die decodes the codeword, and sends back only the data bits to memory controller 102. However, in some cases, the control die may be unable to successfully decode a codeword. In this case, the control die may send the entire codeword to memory controller 102, which uses ECC engines 226/256 to decode the codeword.

In some embodiments, the ECC engines have different modes, such as ECC mode A 226a/256a and ECC mode B 226b/256b. The two modes may differ in their resolution. In general, a higher resolution decoder is able to correct a higher number of bit errors. In one embodiment, the resolution refers to the number of bits in messages that are passed in an iterative message passing decoder. For example, the messages in ECC Mode B 226b/256b may have 6 bits, whereas the messages in ECC Mode A 226a/256a may have 3 bits. In some embodiments, using fewer bits in the messages (corresponding to a lower resolution) results in faster decoding. Using fewer bits in the messages may also consume less power. Further details of decoders having different resolutions are described in U.S. Pat. No. 10,218,384, entitled "ECC Decoder with Multiple Decode Modes," which is incorporated herein by reference.

The XOR engines 224/254 may be used to form redundancy information that is based on information from each codeword in a set of codewords. The redundancy information may be stored in one of the memory dies. This redundancy information may be used to recover the data bits for each of the codewords in the set. As one example, each codeword could be 4 kilobytes, each codeword may be for one page of data, and redundancy information may be formed from a bitwise XOR of each of the codewords. In one embodiment, the bitwise XOR has the same number of bits of each codeword.

Data path controller 222 is connected to a memory interface 228 for communicating by way of four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 3. Additionally, memory controllers with structures different than FIGS. 2 and 3 can also be used with the technology described herein.

Figure 4:
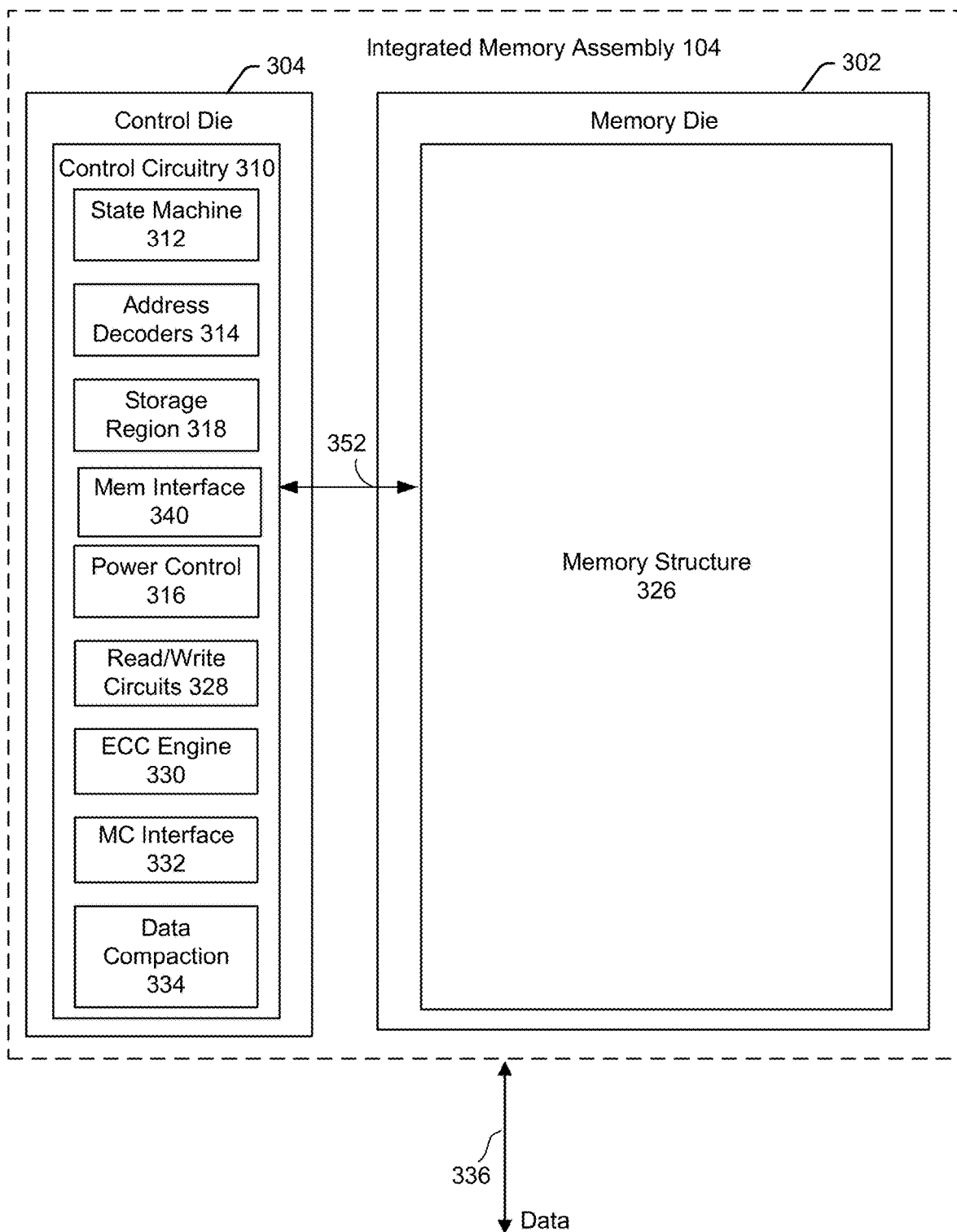
FIG. 4 is a functional block diagram of an integrated memory assembly.

FIG. 4 is a functional block diagram of one embodiment of an integrated memory assembly 104. In one embodiment, the integrated memory assembly 104 includes two semiconductor die (or more succinctly, "die"): memory die 302 and control die 304. Memory die 302 includes include memory structure 326. Memory structure 326 includes non-volatile memory cells. Control die 304 includes control circuitry 310. In some embodiments, the memory die 302 and the control die 304 are directly bonded together, as will be described in more detail below. For purposes of this document, the phrase directly bonded refers to the memory die being bonded to the control die with no other die between the memory die and the control die.

Control circuitry 310 comprises a set of electrical circuits that perform memory operations (e.g., write, read, erase and others) on memory structure 326. Control circuitry 310 includes state machine 312, an on-chip address decoder 314, a power control circuit 316, storage region 318, read/write circuits 328, ECC engine 330, memory controller interface 332, memory die interface 340, and data compaction circuit 334. In another embodiment, a portion of the read/write circuits 328 are located on control die 304 and a portion of the read/write circuits 328 are located on memory die 302. For example, the read/write circuits 328 may contain sense amplifiers. In one embodiment, the sense amplifiers (for reading data from the memory die) are located on the control die 304. In one embodiment, the sense amplifiers are located on the memory die 302.

Herein, the term, "memory die," "memory semiconductor die," or the like, means a semiconductor die that contains non-volatile memory cells for storage of data. Herein, the term, "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

State machine 312 is an electrical circuit that controls the operations performed by control die 304. In some embodiments, state machine 312 is implemented by or replaced by a microprocessor, microcontroller and/or RISC processor.

Storage region 318 can be volatile memory used to store software for programming a processor (e.g., the RISC processor used to implement or replace state machine 312) and for storing data (e.g., data for the decoding process and encoding process and operational parameters). In one embodiment, storage region 312 is implemented with SRAM or DRAM.

The on-chip address decoder 314 provides an address interface between addresses used by host 120 or memory controller 102 to the hardware address used by row decoders and column decoders (not expressly depicted in FIG. 4). Power control circuit 316 controls the power and voltages supplied to the word lines, bit lines, and select lines during memory operations. The power control circuit 316 includes voltage circuitry, in one embodiment. Power control circuit 316 may include charge pumps or other voltage sources for creating voltages. The power control circuit 316 executes under control of the state machine 312.

The read/write circuits 328 includes sense blocks (which may contain sense amplifiers (SA), in some embodiments. The sense amplifies include bit line drivers, in some embodiments. The read/write circuits 328 executes under control of the state machine 312, in one embodiment. Each memory structure 326 is addressable by word lines by way of a row decoder (not depicted in FIG. 3A) and by bit lines by way of a column decoder (not depicted in FIG. 3A), in some embodiments.

The error correction code (ECC) engine 330 is a circuit configured to decode and error correct codewords. Herein, ECC engine 330 may be referred to as an on-die ECC engine. In one embodiment, the on-die ECC engine 330 is configured to encode data bits from memory controller 102 into codewords that contain the data bits and parity bits. The control circuitry stores the codewords in the memory structure 326. In one embodiment, the on-die ECC engine 330 is also configured to decode the codewords which are read from the memory structure 326. In some embodiments, if the on-die ECC engine 330 is successful at decoding a codeword, then the control die 304 only sends back the data bits to the memory controller 102. In some embodiments, if the on-die ECC engine 330 is not successful at decoding a codeword, then the memory controller ECC engine 226/256 may be used to decode the codeword.

In some embodiments, first the control die 304 attempts to decode a codeword using ECC engine 330. If decoding fails, the memory controller 102 may attempt to decode that codeword. In some embodiments, the memory controller 102 has multiple ECC modes. For example, ECC mode A 226A (see FIG. 3) may be used to attempt to decode a codeword that the control die 304 could not decode. If ECC Mode A 226a fails to decode the codeword, then ECC mode B 226b may be used by the memory controller 102. For example, the on-die ECC engine 330 may use a hard bit decoder to attempt to decode a codeword. Under typical conditions, hard bit decoding may be successful most of the time. In the event that the on-die ECC engine 330 fails to successfully decode the codeword, the codeword may be passed to memory controller 102. In one embodiment, memory controller 102 first attempts to decode using a soft bit decoder at one level of resolution. This first attempt may be made by ECC Mode A 226a. If the first attempt by memory controller 102 fails, then the memory controller may use a soft bit decoder at higher level of resolution. This second attempt may be made by ECC Mode B 226b. Note that the aforementioned hard bit decoder may use less power than the soft bit decoders. Hence, most of the time the decoding may be achieved using a low power decoder on the control die 304. None of the on-die ECC engine 330, ECC Mode A 226A, nor ECC Mode B 226b are limited to the foregoing examples.

In one embodiment, all or a subset of the circuits of control circuitry 310 can be considered one or more control circuits. The one or more control circuits can include hardware only (e.g., electrical circuits) or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), microcontroller, integrated circuit or other type of circuit.

Memory interface 340 is an electrical interface between control die 304 and memory doe 302, employing pathways 352. Pathways 352 are pathways between one or more components in the control circuitry 310 and the memory structure on memory die 302. A portion of each pathway resides in memory die 302 and a portion of each pathway resides in control die 304. The term pathway may be used for a portion of pathways 352 that is entirely within one of the die. Thus, it may be stated that the memory die 302 has a first plurality of pathways and that the control die 304 has a second plurality of pathways such that the first plurality of pathways are directly connected to the second plurality of pathways (e.g., no intervening pathways). In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. In one embodiment, pathways 352 allow the control circuitry 310 to provide voltages to word lines, select lines, and bit lines on memory die 302. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

Memory controller interface 332 is an electrical interface for communicating with memory controller 102. For example, memory controller interface 332 may implement a Toggle Mode Interface that connects to the Toggle Mode interfaces of memory interface 228/258 for memory controller 102. In one embodiment, memory controller interface 332 includes a set of input and/or output (I/O) pins that connect to communication channel 336 (also refers to herein as a data bus). In one embodiment, communication channel 336 connects to the memory controller 102 as part of the Toggle Mode Interface. In one embodiment, a communication channel 336 of one integrated memory assembly 104 connects to another integrated memory assembly 104.

Memory interface 340 is significantly wider than memory controller interface 332 because memory interface 340 has significantly more signals than memory controller interface 332. Therefore, more data can be sent in parallel for memory interface 340 as compared to memory controller interface 332. In some examples, memory interface 340 is 4×, 10×, 20×, or 50× wider than memory controller interface 332.

Communication channel 336 is depicted as being connected to integrated memory assembly 104 for generality. Communication channel 336 may connect to either or both of die 302 and/or 304. In one embodiment, communication channel 336 connects memory controller 102 directly to control die 304. In one embodiment, communication channel 336 connects memory controller 102 directly to memory die 302. If communication channel 336 connects memory controller 102 directly to memory die 302, then pathway 352 may be used to allow communication between memory controller 102 and control circuitry 310.

Data compaction circuit 334 is used to compact fragmented data on memory die 302, as discussed below. In other embodiments, the data compaction function can be implemented using software running on the stat machine or other processor.

In one embodiment, memory structure 326 comprises a monolithic three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments disclosed herein. Other examples of suitable technologies for memory cells of the memory structure 326 include phase change memory ("PCM"), Magnetoresistive Random-Access Memory ("MRAM"), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 4 depicts one control die 304 and one memory die 302 in an integrated memory assembly 104, there may be more than one control die 304 and more than one memory die 302 in an integrated memory assembly 104.

Figure 5:
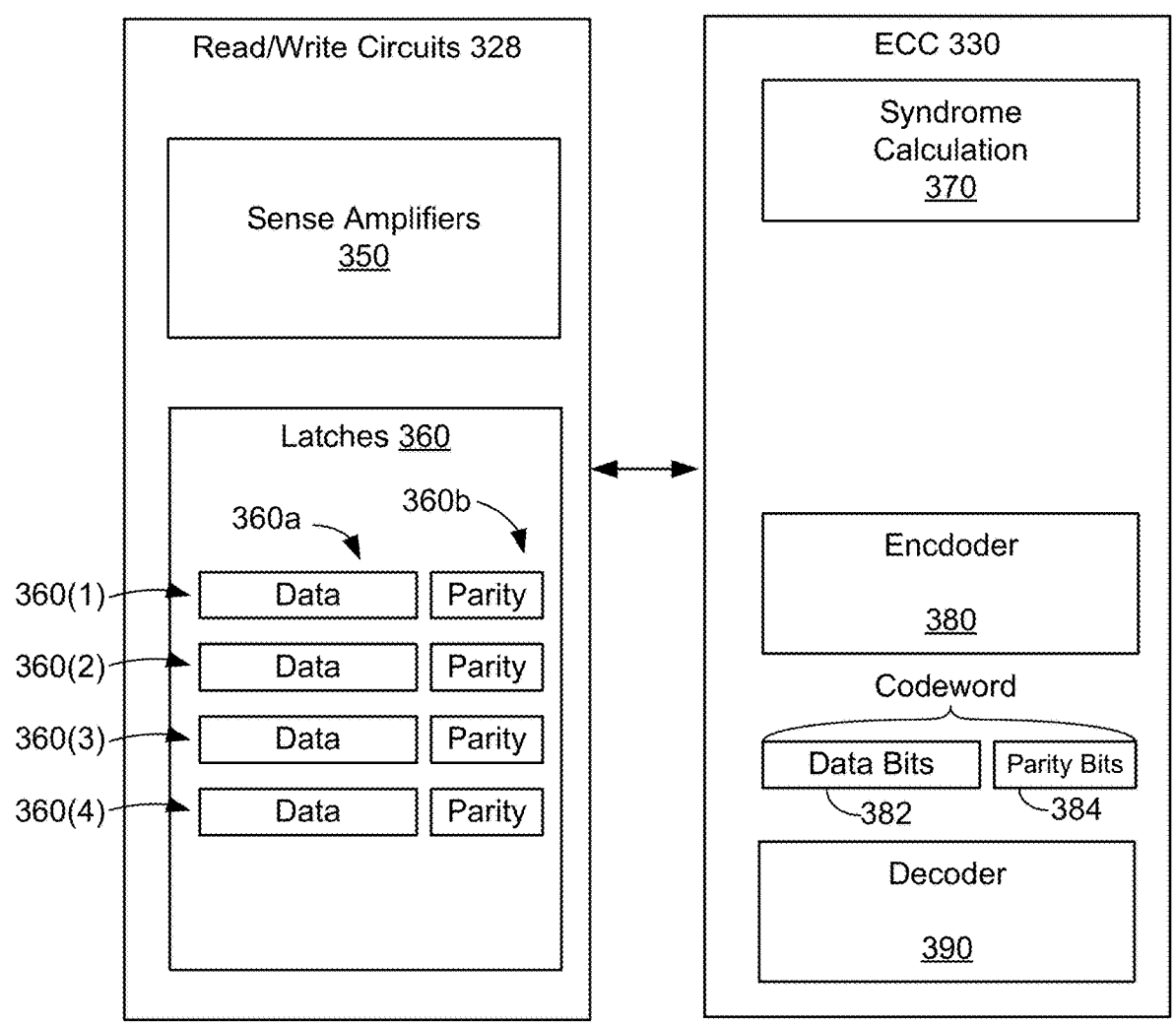
FIG. 5 is a block diagram of one embodiment of a read/write circuits and ECC circuit of an integrated memory assembly.

FIG. 5 is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 5 depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In an embodiment in which three bits are stored per memory cell, three pages are stored in a set of memory cells and the four pages may be referred to as a lower page (LP), middle page (MP), and an upper page (UP). In another embodiment, the sense amplifiers 350 are on the memory die 302, but the latches 360 remain on the control die 304.

The on-die ECC engine 330 is able to encode data bits received from memory controller 102. In one embodiment, the on-die ECC engine 330 forms codewords that each contain data bits and parity bits. In one embodiment, memory controller 102 provides the codewords to the control die 304. Control circuitry 310 stores the codewords into non-volatile memory cells in the memory structure 326. Upon a request from memory controller 102 to read data, control circuitry 310 reads codewords from memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code or error correction information) may be stored with the unit of data (e.g., page). The combination of the unit of data and its associated parity bits are referred to as a codeword. In one embodiment, the parity bits are stored remotely from the unit of data (e.g., page).

In an embodiment, upon successfully decoding a codeword, the control die 304 sends only the data bits, but not the parity bits, to memory controller 102. Therefore, bandwidth over communication lines between memory controller 102 and the integrated memory assembly 104 is saved. Also, substantial power may be saved. For example, the interface between the control die and the controller could be a high speed interface.

The on die ECC engine 330 includes syndrome calculation logic 370, an encoder 380, and a decoder 390. The encoder 380 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. The encoder 380 may form a codeword, which contains data bits 382 and parity bits 384. The data bits may be provided by memory controller 102.

Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming by a voltage generator on control die 304 applying the program voltage and boosting voltages to various word lines of memory structure 326.

Decoder 390 is configured to decode the codewords that were stored in the memory die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on memory controller 102. In one embodiment, the decoder on memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In another embodiment, the decoder 390 implements a soft bit decoder. Alternatively, decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation. The message passing computation may be based on belief propagation.

Syndrome calculation logic 370 (e.g., an electrical circuit and/or software) is able to determine a syndrome weight for codewords. The syndrome weight refers to the number of parity check equations that are unsatisfied. The initial syndrome weight of a codeword may correlate with the bit error rate (BER) of that codeword. Thus, the control die 304 may estimate a BER for a codeword based on the initial syndrome weight. In one embodiment, the syndrome logic is implemented in hardware. The syndrome weight can be determined without fully decoding a codeword. Hence, the initial syndrome weight can be calculated in less time and with less power than for decoding a codeword. In some embodiments, the control die 304 makes management decisions based on the estimated BER. For example, the control die 304 may determine what technique should be used to decode a codeword, what read reference voltages should be used to read memory cells, etc. based on the estimated BER.

Figures 6A, 6B:
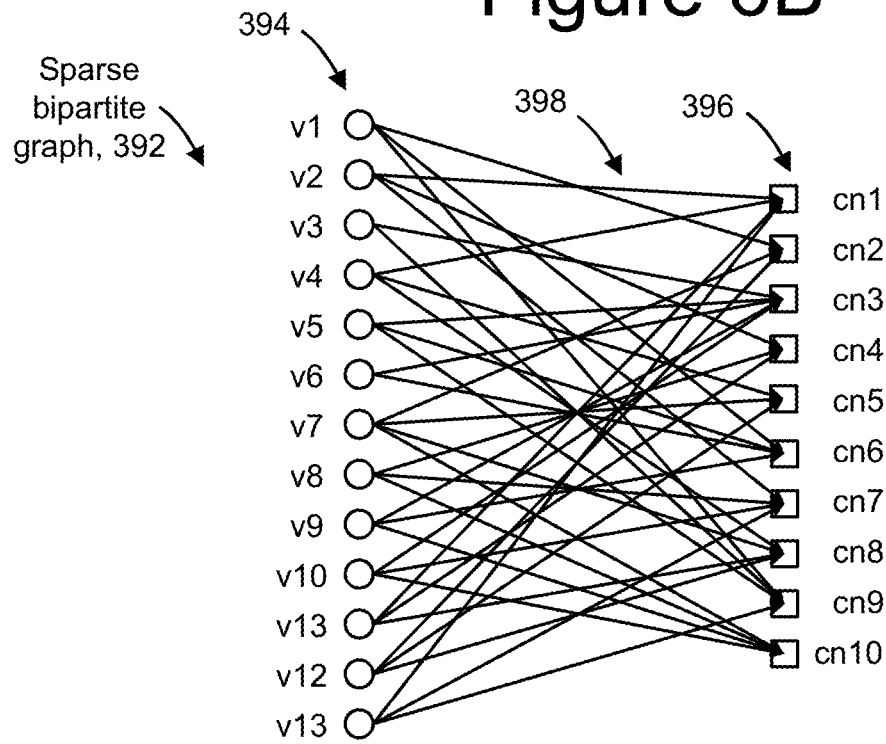
FIG. 6A depicts an example of a sparse parity check matrix H.
FIG. 6B depicts a sparse bipartite graph which corresponds to the sparse parity check matrix of FIG. 6A.

In one embodiment, on-die ECC engine 330 uses a sparse parity check matrix. FIG. 6A depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 6B depicts a sparse bipartite graph 392 which corresponds to the sparse parity check matrix of FIG. 6A. Specifically, the code can be defined by a sparse bipartite graph G=(V,C,E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13 = 0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12 = 0$, the third parity check at cn3 determines if $v3 \oplus v5 \oplus v6 \oplus v9 \oplus v10 = 0$, the fourth parity check at cn4 determines if $v2 \oplus v8 \oplus v11 = 0$, the fifth parity check at cn5 determines if $v4 \oplus v7 \oplus v12 = 0$, the sixth parity check at cn6 determines if $v1 \oplus v5 \oplus v6 \oplus v9 = 0$, the seventh parity check at cn7 determines if $v2 \oplus v8 \oplus v10 \oplus v13 = 0$, the eighth parity check at cn8 determines if $v4 \oplus v7 \oplus v11 \oplus v12 = 0$, the ninth parity check at cn9 determines if $v1 \oplus v3 \oplus v5 \oplus v13 = 0$ and the tenth parity check at cn10 determines if $v7 \oplus v8 \oplus v9 \oplus v10 = 0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 7:
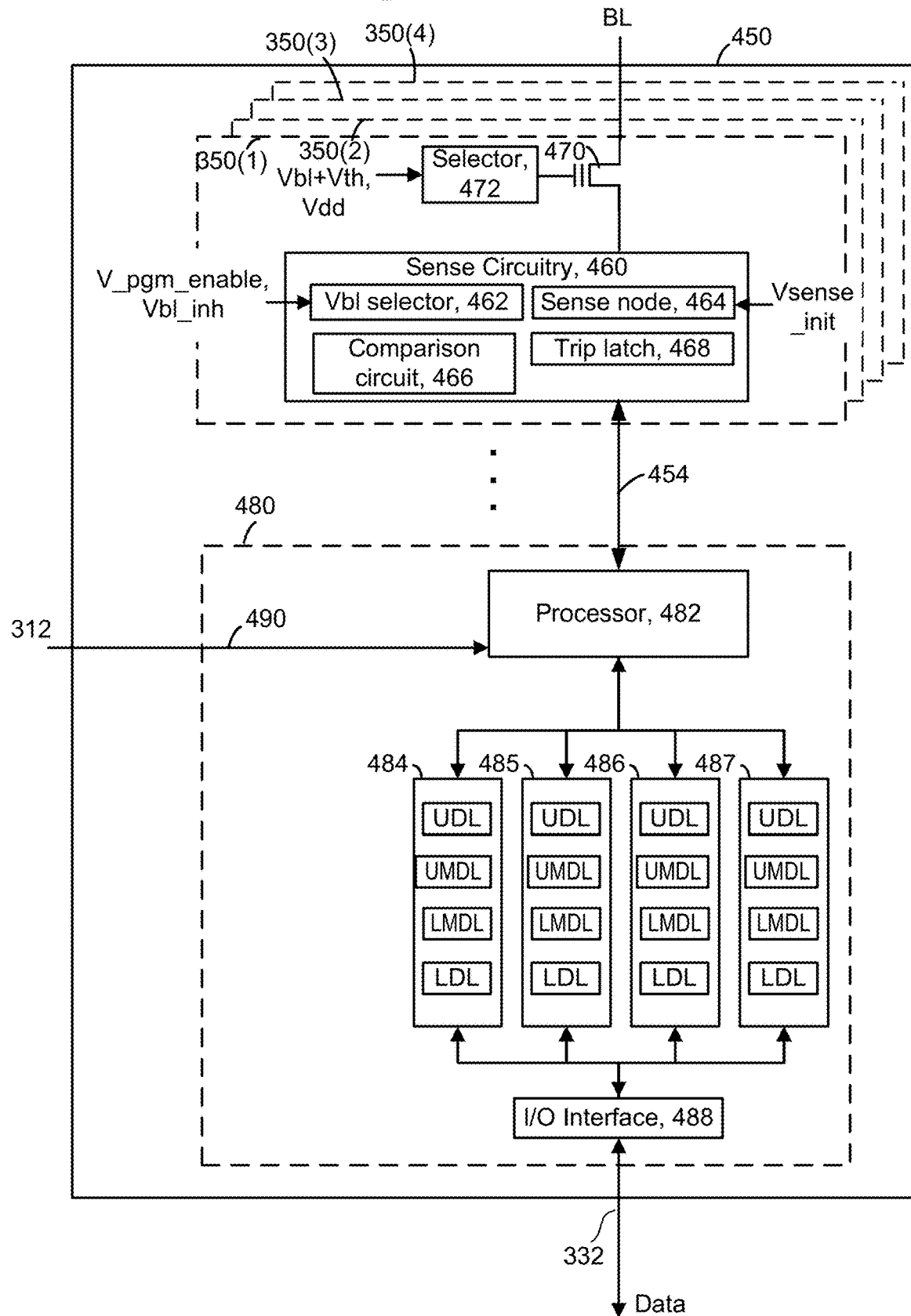
FIG. 7 is a block diagram depicting one embodiment of a sense block.

FIG. 7 is a block diagram depicting one embodiment of a sense block 450. The sense block is part of the read/write circuits 328. An individual sense block 450 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit by way of data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation (e.g., write operation).

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. The Vbl selector 462 can also be used during sensing operations. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line. The bit lines are part of memory structure 326 on memory die 302.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line by way of the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The managing circuit 480 comprises a processor 482, four example sets of data latches 484, 485, 486, 487 and an I/O Interface 488 coupled between the sets of data latches and data bus 332 (data bus may connect to memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell and, therefore, only three latches (LDL, MDL, UDL) per sense amplifier.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 332 during a program operation which represent write data meant to be programmed into the memory. I/O interface 488 provides an interface between data latches 484-487 and the data bus 332.

The processor 482 may also be used to determine what voltage to apply to the bit line, based on the state of the latches.

During reading, the operation of the system is under the control of state machine 312 that controls the supply of different control gate voltages to the addressed memory cell (e.g., by applying voltages from power control 316 to word lines on the memory structure 326 by way of the pathways between control die 304 and memory die 302 discussed herein). As it steps through the various predefined control gate voltages corresponding to the various memory states supported by the memory, the sense circuit may trip at one of these voltages and a corresponding output will be provided from sense circuit to processor 482 by way of the data bus 454. At that point, processor 482 determines the resultant memory state by consideration of the tripping event(s) of the sense circuit and the information about the applied control gate voltage from the state machine by way of input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR' d together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because (in one embodiment) each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 8:
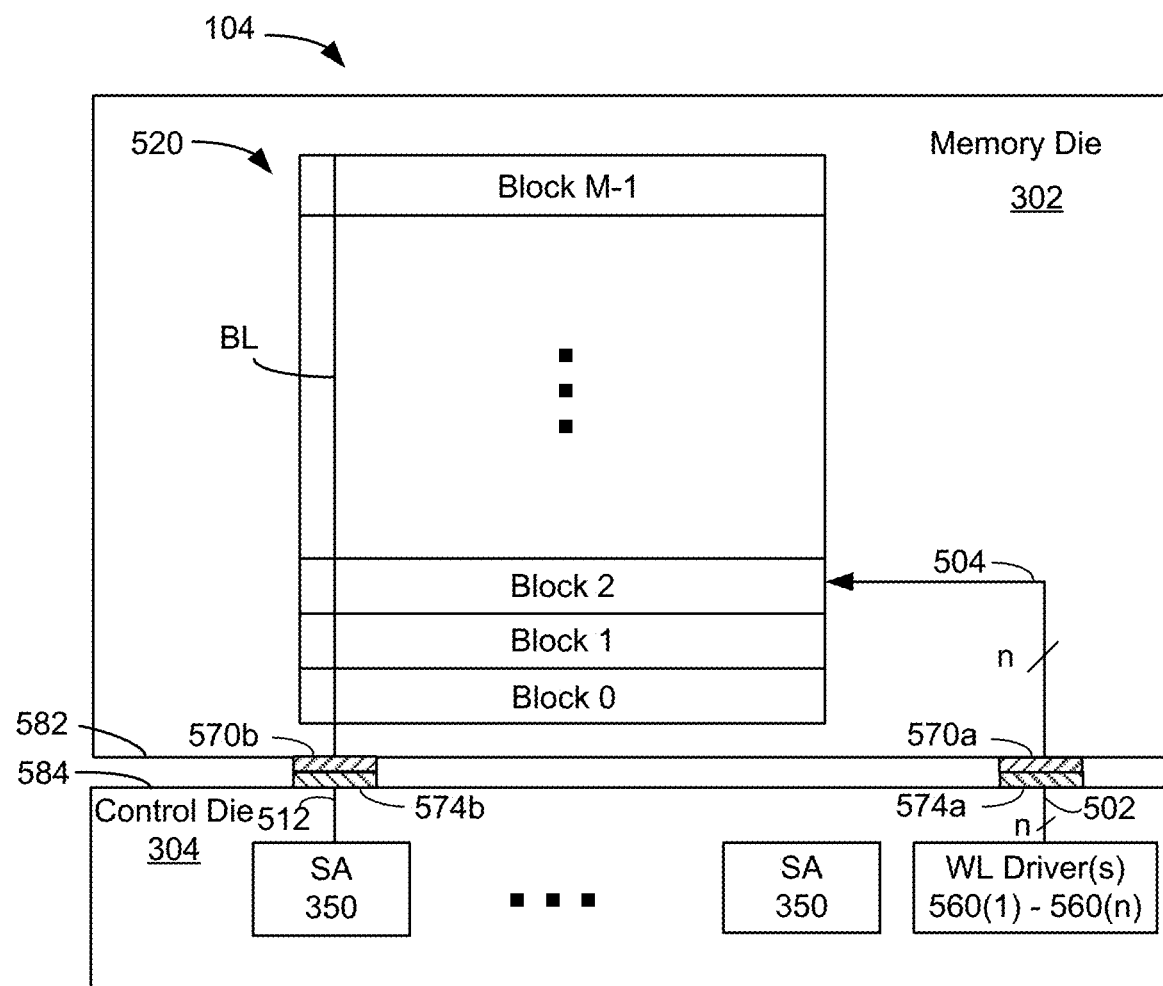
FIG. 8 is a block diagram of one embodiment of an integrated memory assembly.

FIG. 8 is a block diagram of one embodiment of an integrated memory assembly 104. FIG. 8 depicts further details of one embodiment of the integrated memory assembly 104 of FIGS. 1 and 4. Memory die 302 contains a plane 520 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In one embodiment, the block is the unit of erase. However, other embodiments can utilize other units of erase. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 8, Block 0 and Block M−1 of plane 520 are at the edges of the memory structure (or otherwise referred to as being located in an edge region/section of the memory structure).

Control die 304 includes a number of sense amplifiers (SA) 350. Each sense amplifier 350 is connected to one bit line. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 560(1)-560(n). The word line drivers 560 are configured to provide voltages to word lines. In this example, there are "n" word lines per block of memory cells. In one embodiment, one of the blocks in the plane 520 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 560 (e.g. part of Power Control 316) provide voltages to the word lines in a first selected block (e.g., Block 2) in memory die 302. The control die 304 may also include charge pumps, voltage generators, and the like, which may be used to provide voltages for the word line drivers 560 and/or the bit line drivers.

The memory die 302 has a number of bond pads 570a, 570b on a first major surface 582 of memory die 302. There may be "n" bond pads 570a, to receive voltages from a corresponding "n" word line drivers 560(1)-560(n). There may be one bond pad 570b for each bit line associated with plane 520. The reference numeral 570 will be used to refer in general to bond pads on major surface 582.

In some embodiments, each data bit and each parity bit of a codeword are transferred through a different bond pad pair 570b, 574b. The bits of the codeword may be transferred in parallel over the bond pad pairs 570b, 574b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 574a, 574b on a first major surface 584 of control die 304. There may be "n" bond pads 574a, to deliver voltages from a corresponding "n" word line drivers 560(1)-560(n) to memory die 302a. There may be one bond pad 574b for each bit line associated with plane 520. The reference numeral 574 will be used to refer in general to bond pads on major surface 582. Note that there may be bond pad pairs 570a/574a and bond pad pairs 570b/574b. In some embodiments, bond pads 570 and/or 574 are flip-chip bond pads.

In one embodiment, the pattern of bond pads 570 matches the pattern of bond pads 574. Bond pads 570 are bonded (e.g., flip chip bonded) to bond pads 574. Thus, the bond pads 570, 574 electrically and physically couple the memory die 302 to the control die 304. Also, the bond pads 570, 574 permit internal signal transfer between the memory die 302 and the control die 304. Thus, the memory die 302 and the control die 304 are bonded together with bond pads. Although FIG. 5A depicts one control die 304 bonded to one memory die 302, in another embodiment one control die 304 is bonded to multiple memory dies 302.

Herein, "internal signal transfer" means signal transfer between the control die 304 and the memory die 302. The internal signal transfer permits the circuitry on the control die 304 to control memory operations in the memory die 302. Therefore, the bond pads 570, 574 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 570, 574 may be formed for example of copper, aluminum and alloys thereof. There may be a liner between the bond pads 570, 574 and the major surfaces (582, 584). The liner may be formed for example of a titanium/titanium nitride stack. The bond pads 570, 574 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 570, 574. Several conductive pathways, which may be implemented with metal interconnects and/or vias are depicted. For example, a sense amplifier 350 may be electrically connected to bond pad 574b by pathway 512. There may be thousands of such sense amplifiers, pathways, and bond pads. Note that the BL does not necessarily make direct connection to bond pad 570b. The word line drivers 560 may be electrically connected to bond pads 574a by pathways 502. Note that pathways 502 may comprise a separate conductive pathway for each word line driver 560(1)-560(n). Likewise, there may be a separate bond pad 574a for each word line driver 560(1)-560(n). The word lines in block 2 of the memory die 302 may be electrically connected to bond pads 570a by pathways 504. In FIG. 8, there are "n" pathways 504, for a corresponding "n" word lines in a block. There may be a separate pair of bond pads 570a, 574a for each pathway 504.

Figure 9:
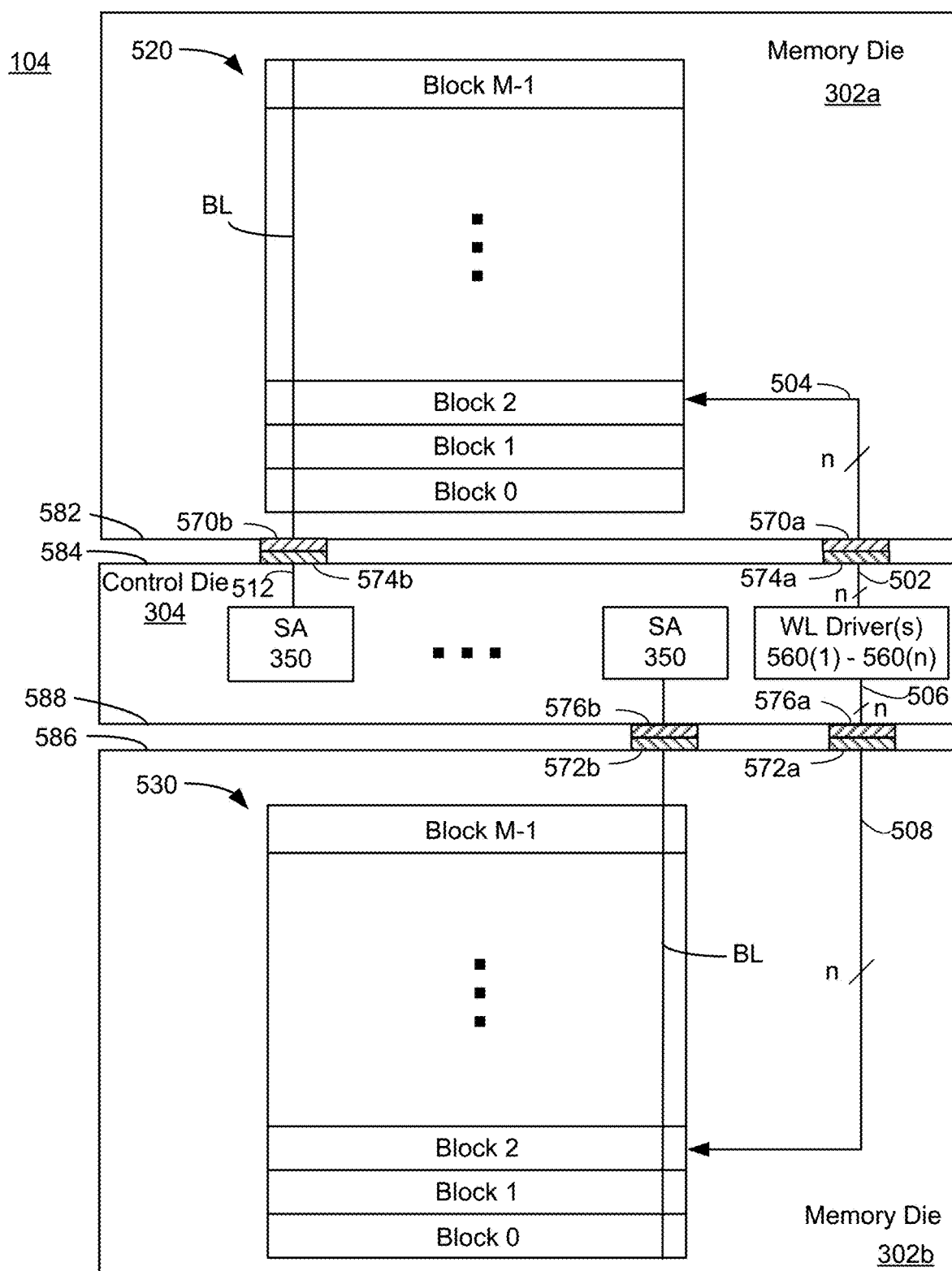
FIG. 9 is a block diagram of one embodiment of an integrated memory assembly in which a control die controls two memory dies.

FIG. 9 depicts another embodiment of an integrated memory assembly 104 in which one control die 304 may be used to control two memory die 302a, 302b. The control die 304 has a number of a number of bond pads 574(a), 574(b) on a first major surface 584, as discussed in connection with FIG. 8. The control die 304 has a number of a number of bond pads 576(a), 576(b) on a second major surface 588. There may be "n" bond pads 576(a) to deliver voltages from a corresponding "n" word line drivers 560(1)-560(n) to memory die 302b. The word line drivers 560 may be electrically connected to bond pads 576a by pathways 506. There may be one bond pad 576b for each bit line associated with plane 530 on memory die 302b. The reference numeral 576 will be used to refer in general to bond pads on major surface 588.

The second memory die 302b has a number of bond pads 572(a), 572(b) on a first major surface 586 of second memory die 302b. There may be "n" bond pads 572(a), to receive voltages from a corresponding "n" word line drivers 560(1)-560(n). The word lines in plane 530 may be electrically connected to bond pads 572a by pathways 508. There may be one bond pad 572(b) for each bit line associated with plane 530. The reference numeral 572 will be used to refer in general to bond pads on major surface 586. Note that there may be bond pad pairs 572(a)/576(a) and bond pad pairs 572(b)/576(b). In some embodiments, bond pads 572 and/or 576 are flip-chip bond pads.

In an embodiment, the "n" word line drivers 560(1)-560(n) are shared between the two memory die 302a, 302b. For example, a single word line driver may be used to provide a voltage to a word line in memory die 302a and to a word line in memory die 302b. However, it is not required that the word line drivers 560 are shared between the memory dies 302a, 302b.

Figure 10A:
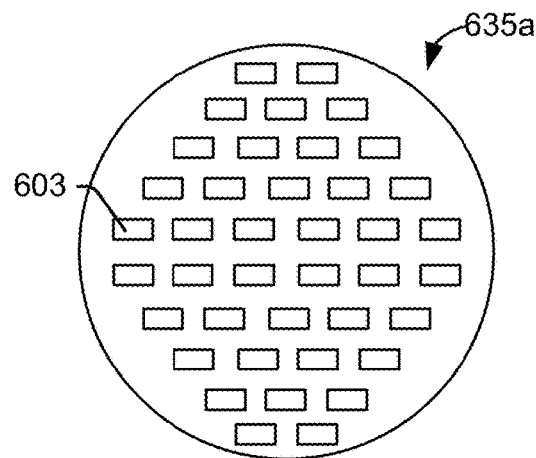
FIGS. 10A and 10B are top views of semiconductor wafers.

FIG. 10A is a top view of a semiconductor wafer 635a from which multiple control die 304 may be formed. The wafer 635a has numerous copies of integrated circuits 603. Each of the integrated circuits 603 contains the control circuitry 310 (see FIG. 4). Wafer 635a is diced into semiconductor dies, each containing one of the copies of the integrated circuits 603. Therefore, numerous control semiconductor dies 304 may be formed from the wafer 635a. Also note that even before the wafer 635a is diced, as the term "control semiconductor die" is used herein, each region in which an integrated circuit 603 resides may be referred to as a control semiconductor die 304.

Figure 10B:
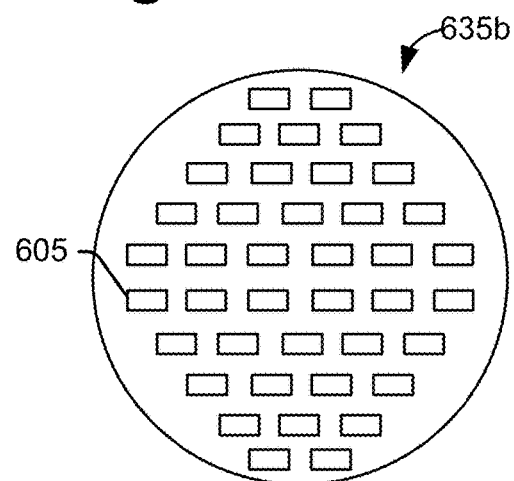

FIG. 10B is a top view of a semiconductor wafer 635b from which multiple memory die 302 may be formed. The wafer 635b has numerous copies of integrated circuits 605. Each of the integrated circuits 605 contains memory structure 326 (see FIG. 4), in one embodiment. The wafer 635b is diced into semiconductor dies, each containing one of the copies of the integrated circuits 605, in some embodiments. Therefore, numerous memory semiconductor dies 302 may be formed from the wafer 635b. Also note that even before the wafer 635b is diced, as the term "memory semiconductor die" is used herein, each region in which an integrated circuit 605 resides may be referred to as a memory semiconductor die 302.

The semiconductor wafers 635 may start as an ingot of monocrystalline silicon grown according to either a CZ, FZ or other process. The semiconductor wafers 635 may be cut and polished on major surfaces to provide smooth surfaces. The integrated circuits 603, 605 may be formed on and/or in the major surfaces. Note that forming the integrated circuits 603, 605 on different wafers 635a, 635b facilitates use of different semiconductor fabrication processes on the different wafers 635a, 635b. For example, semiconductor fabrication processes may involve high temperature anneals. Such high temperature anneals may be needed for formation of some circuit elements, or may be useful for improving properties of circuit elements. For example, a high temperature anneal can desirably reduce the resistance of polysilicon on the memory dies 302. However, the high temperature anneal could be damaging to other circuit elements. For example, a high temperature anneal can potentially be damaging to CMOS transistors, such as the transistors that may be used on the semiconductor dies 304. In one embodiment, a high temperature anneal that is used when fabricating the integrated circuits 605 on wafer 635b is not used when fabricating the integrated circuits 603 on wafer 635a. For example, in one embodiment, a high temperature anneal that is used when fabricating the memory dies is not used when fabricating the control dies.

The dicing of the wafers 635 into semiconductor dies may occur before or after bonding. In one embodiment, the two wafers 635, 635b are bonded together. After bonding the two wafers together, dicing is performed. Therefore, numerous integrated memory assemblies 104 may be formed from the two wafers 635. In another embodiment, the two wafers 635a, 635b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304 and a memory semiconductor die 302 bonded together.

Figure 10C:
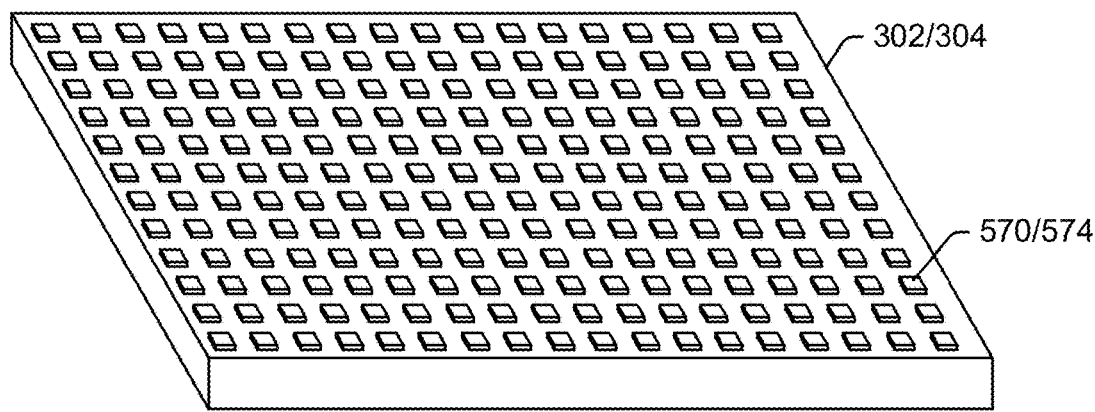
FIG. 10C depicts an example pattern of bond pads on a planar surface of a semiconductor die.

As has been discussed above, the control die 304 and the memory die 302 may be bonded together. Bond pads on each die 302, 304 may be used to bond the two dies together. FIG. 10C depicts an example pattern of bond pads on a planar surface of a semiconductor die. The semiconductor die could be memory die 302 or control die 304. The bond pads could be any of bond pads 570 or 574, as appropriate for the semiconductor die. There may be many more bond pads than are depicted in FIG. 10C. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 570, 574 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302 and 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11:
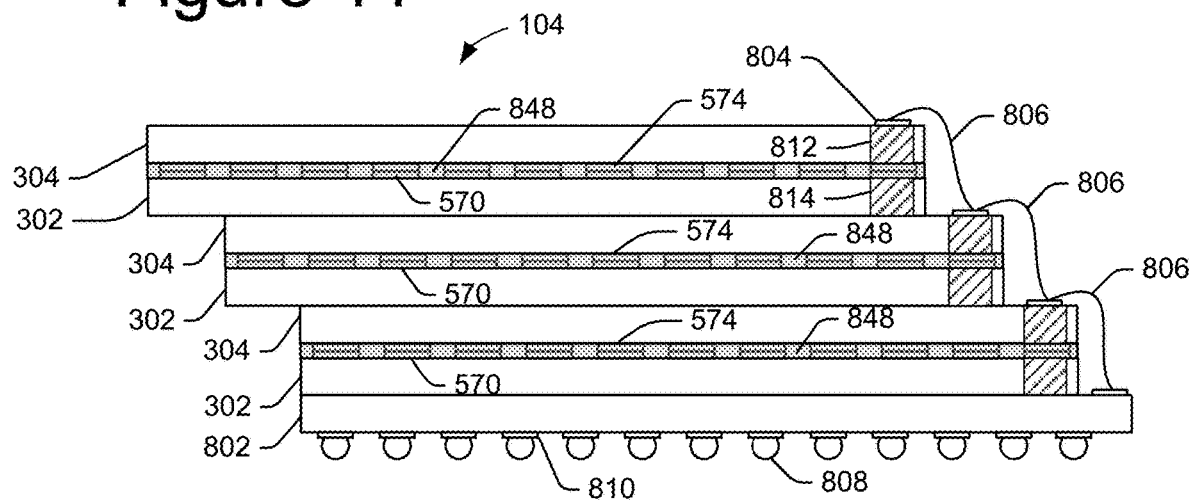
FIG. 11 depicts a side view of an embodiment of an integrated memory assembly stacked on a substrate.

As noted herein, there may be more than one control die 304 and more than one memory die 302 in an integrated memory assembly 104. In some embodiments, the integrated memory assembly 104 includes a stack of multiple control die 304 and multiple memory die 302. FIG. 11 depicts a side view of an embodiment of an integrated memory assembly 104 stacked on a substrate 802. The integrated memory assembly 104 has three control die 304 and three memory die 302. Each control die 304 is bonded to one of the memory die 302. Some of the bond pads 570, 574, are depicted. There may be many more bond pads. A space between two dies 302, 304 that are bonded together is filled with a solid layer 848, which may be formed from epoxy or other resin or polymer. This solid layer 848 protects the electrical connections between the dies 302, 304, and further secures the dies together. Various materials may be used as solid layer 848, but in embodiments, it may be Hysol epoxy resin from Henkel Corp., having offices in California, USA.

The integrated memory assembly 104 may for example be stacked with a stepped offset, leaving the bond pads 804 at each level uncovered and accessible from above. Wire bonds 806 connected to the bond pads 804 connect the control die 304 to the substrate 802. A number of such wire bonds may be formed across the width of each control die 304 (i.e., into the page of FIG. 8A).

A through silicon via (TSV) 812 may be used to route signals through a control die 304. A through silicon via (TSV) 814 may be used to route signals through a memory die 302. The TSVs 812, 814 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package. The solder balls 808 may form a part of the interface between the integrated memory assembly 104 and memory controller 102.

In the embodiment of FIG. 11, the memory dies 302 and the control dies 304 are arranged as pairs. That is, each memory die 302 is bonded to and in communication with a corresponding/matching/paired control die.

Figure 12:
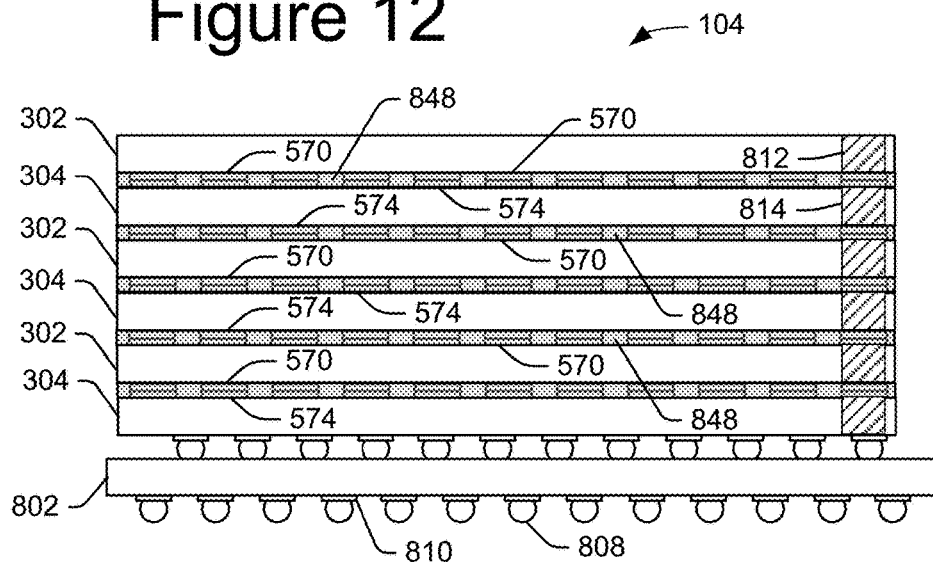
FIG. 12 depicts a side view of an embodiment of an integrated memory assembly stacked on a substrate.

FIG. 12 depicts a side view of an embodiment of an integrated memory assembly 104 stacked on a substrate 802. The integrated memory assembly 104 has three control die 304 and three memory die 302. In this example, each control die 304 is bonded to at least one memory die 302. Optionally, a control die 304 may be bonded to two memory die 302. For example, two of the control die 304 are bonded to a memory die 302 above the control die 304 and a memory die 302 below the control die 304.

Some of the bond pads 570, 574 are depicted. There may be many more bond pads. A space between two dies 302, 304 that are bonded together is filled with a solid layer 848, which may be formed from epoxy or other resin or polymer. In contrast to the example in FIG. 11, the integrated memory assembly 104 in FIG. 12 does not have a stepped offset. A through silicon via (TSV) 812 may be used to route signals through a memory die 302. A through silicon via (TSV) 814 may be used to route signals through a control die 304.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package.

Figure 13:
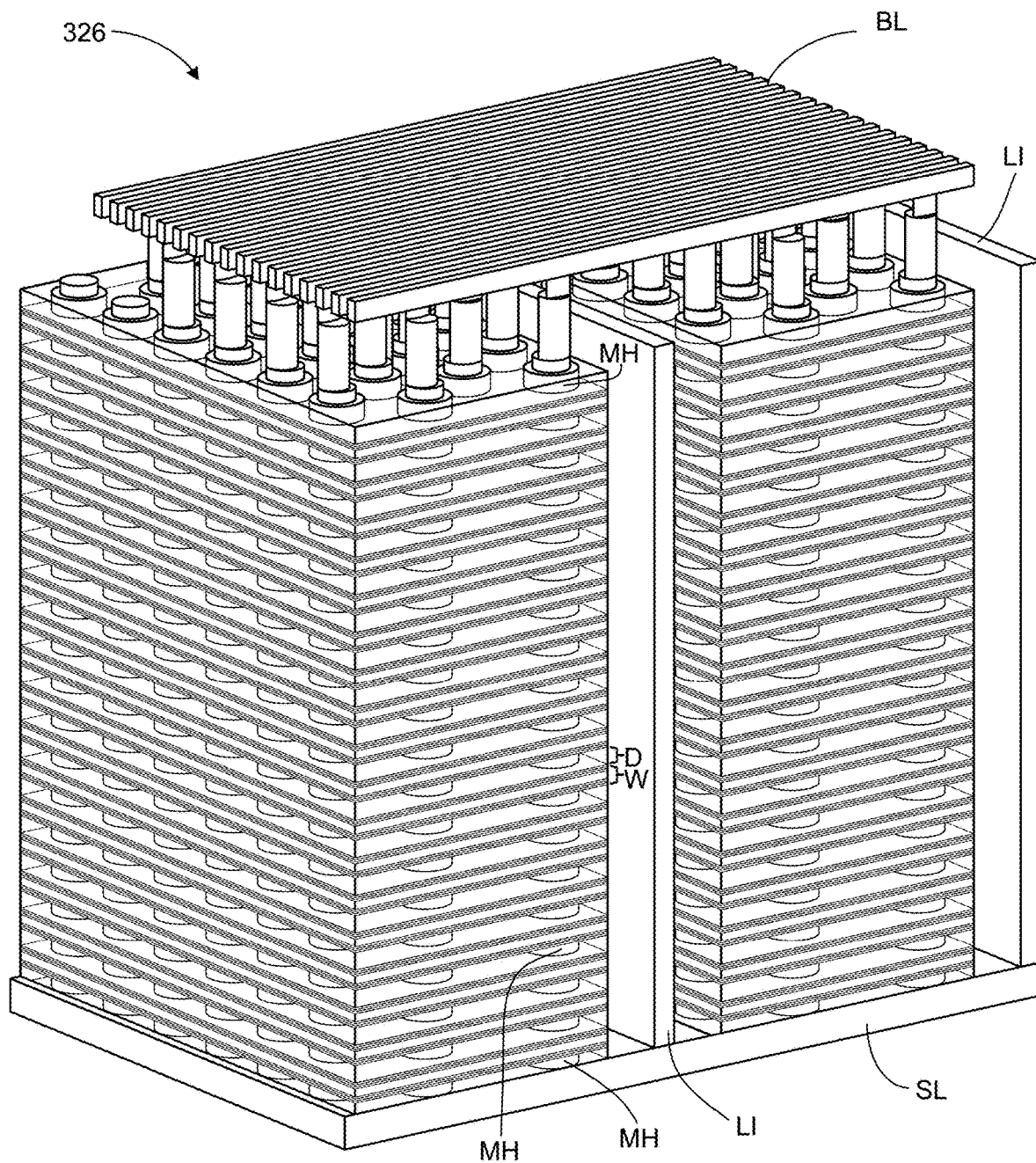
FIG. 13 is a perspective view of a portion of one example embodiment of a monolithic three dimensional memory array.

FIG. 13 is a perspective view of a portion of one example embodiment of a monolithic three dimensional memory array that can comprise memory structure 326, which includes a plurality non-volatile memory cells. For example, FIG. 13 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 913, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. One example of a suitable memory structure 326 is described in U.S. Pat. No. 10,553,298, incorporated herein by reference in its entirety.

Figure 14:
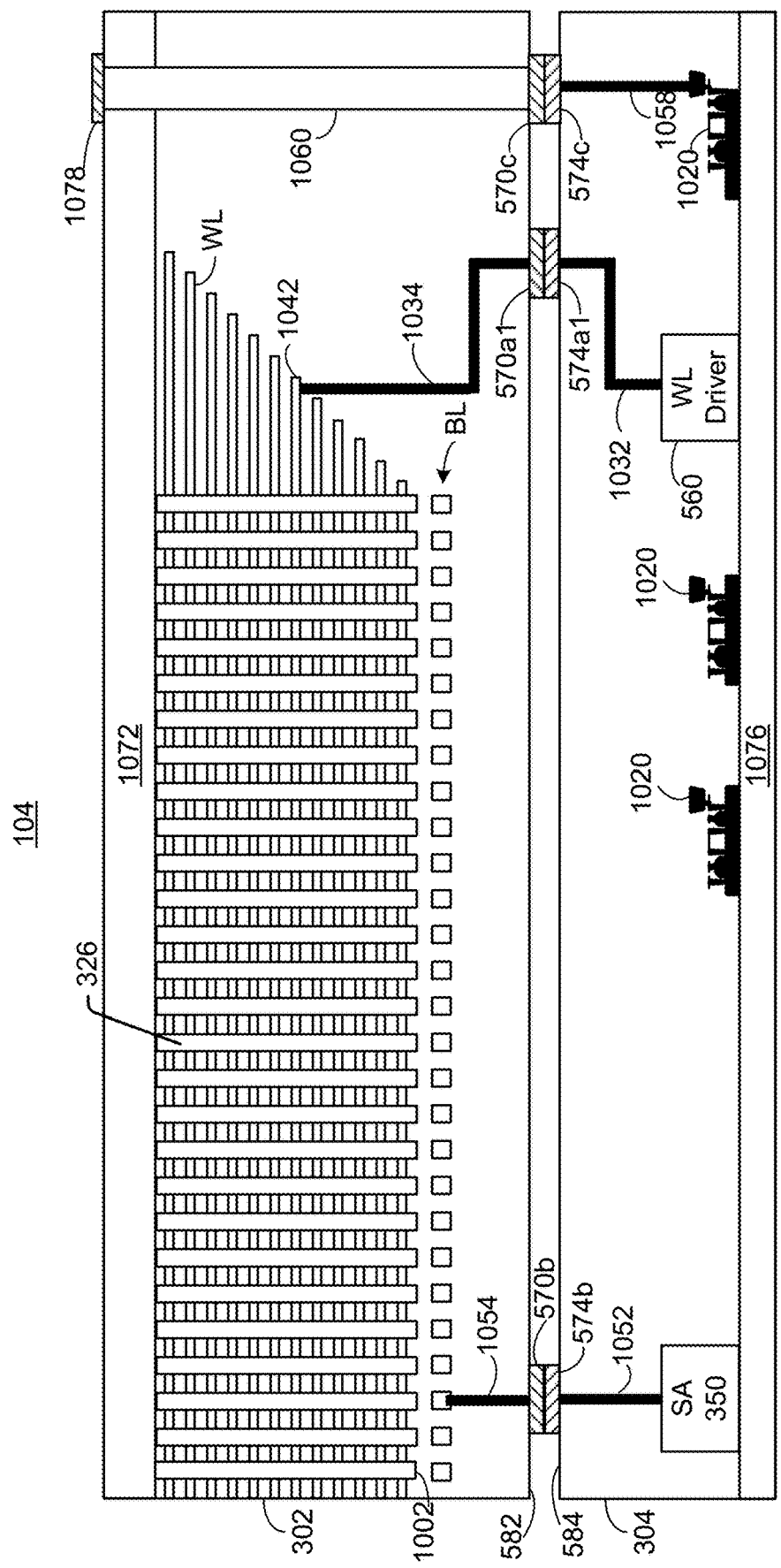
FIG. 14 depicts one embodiment of an integrated memory assembly.

FIG. 14 is a diagram of one embodiment of an integrated memory assembly 104. In an embodiment depicted in FIG. 14, memory die 302 is bonded to control die 304. This bonding configuration is similar to an embodiment depicted in FIG. 8. Note that although a gap is depicted between the pairs of adjacent dies, such a gap may be filled with an epoxy or other resin or polymer. FIG. 14 shows additional details of one embodiment of pathways 352.

The memory die includes a memory structure 326. Memory structure 326 is adjacent to substrate 1072 of memory die 302. In some embodiments, substrate 1072 is formed from a portion of a silicon wafer. In this example, the memory structure 326 include a three-dimensional memory array. The memory structure 326 has a similar structure as the example depicted in FIG. 13. There are a number of word line layers (WL), which are separated by dielectric layers. The dielectric layers are represented by gaps between the word line layers. Thus, the word line layers and dielectric layers form a stack. There may be many more word line layers than are depicted in FIG. 14. As with the example of FIG. 13, there are a number of columns that extend through the stack. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 10A) provide voltages to other word lines. Thus, there are additional bond pad 574a, 570a in addition to bond pads 574a1, 570a1. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310. In some embodiments, sense amplifiers 350, word line driver(s) 560, and/or other circuitry 1020 comprise CMOS circuits.

There is an external signal path that allows circuitry on the control die 304 to communicate with an entity external to the integrated memory assembly 104, such as memory controller 102. Therefore, circuitry 1020 on the control die 304 may communicate with, for example, memory controller 102. Optionally, circuitry on the control die 304 may communicate with, for example, host 120. The external pathway includes via 1058 in control die 304, bond pad 574c, bond pad 570c, through silicon via (TSV) 1060, and external pad 1078. The TSV 1060 extends through substrate 1072.

The TSV 1060, may be formed before, during or after formation of the integrated circuits in the semiconductor dies 302, 304. The TSV may be formed by etching holes through the wafers. For example, holes may be etched through substrate 1072. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to the embodiment depicted in FIG. 14 are possible. One modification is for sense amplifiers 350 to be located on memory die 302.

Figure 15:
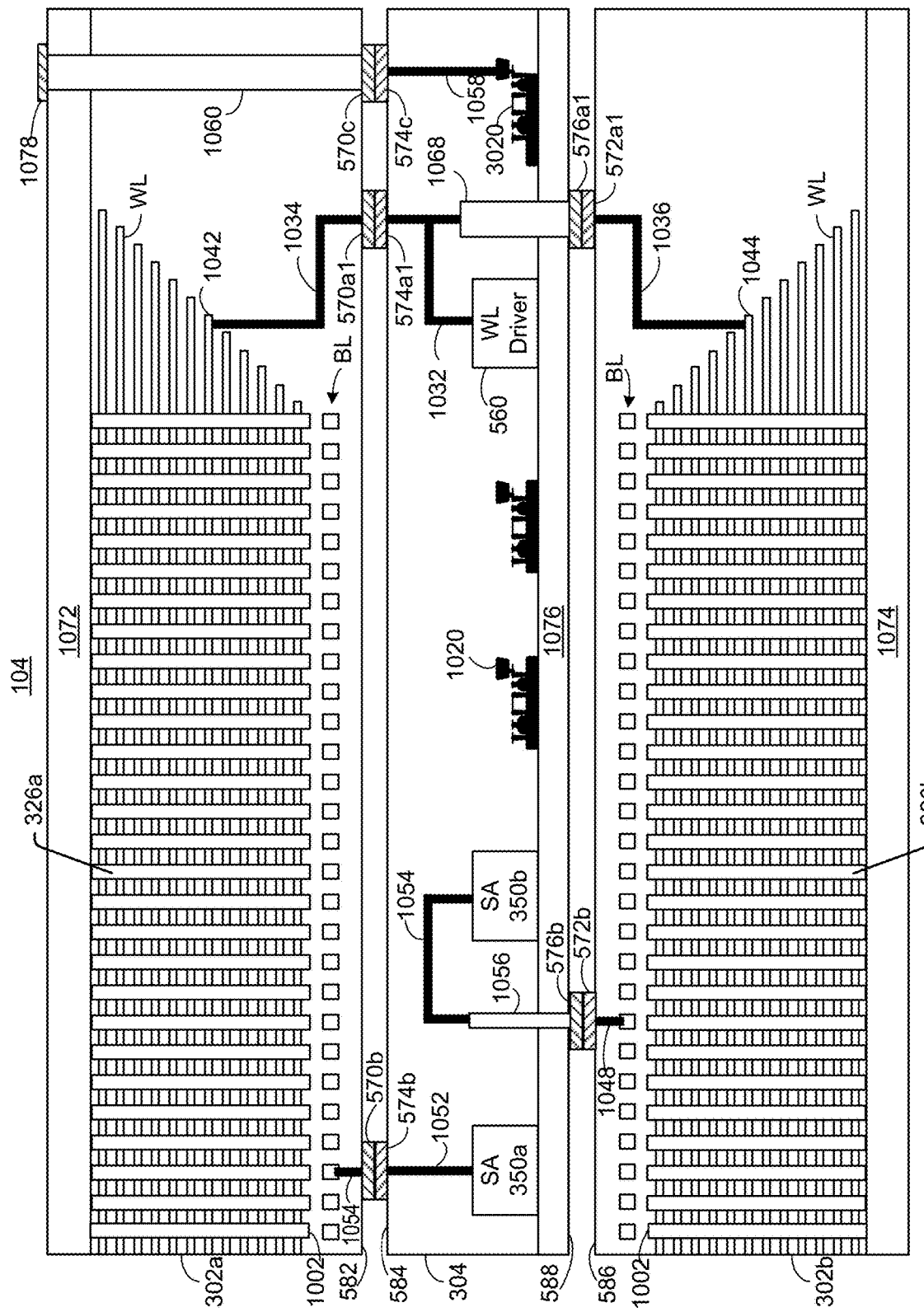
FIG. 15 depicts one embodiment of an integrated memory assembly in which one control die controls two memory die.

FIG. 15 depicts one embodiment of an integrated memory assembly 104. This bonding configuration is similar to an embodiment depicted in FIG. 8. The configuration in FIG. 15 adds an extra memory die relative to the configuration in FIG. 14. Hence, similar reference numerals are used for memory die 302a in FIG. 15, as were used for memory die 302 in FIG. 14. In an embodiment depicted in FIG. 15, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a1, bond pad 572a1, and conductive pathway 1036. Other word line drivers (not depicted in FIG. 10B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048.

Numerous modifications to the embodiment depicted in FIG. 10B are possible. One modification is for sense amplifiers 350a to be located on first memory die 302a, and for sense amplifiers 350b to be located on second memory die 302b.

Figure 16:
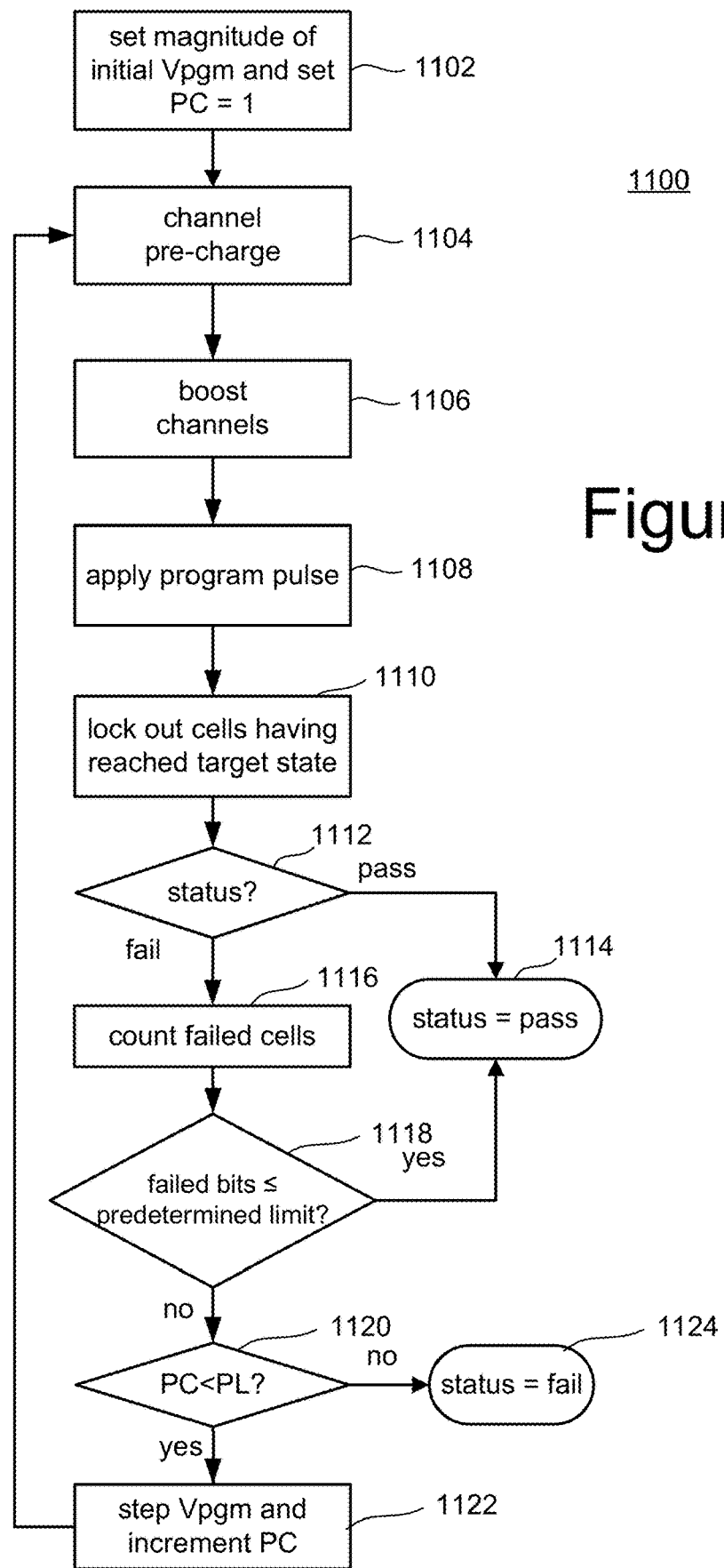
FIG. 16 is a flowchart describing one embodiment of a process for programming non-volatile memory cells organized into a memory array on a memory die.

FIG. 16 is a flowchart describing one embodiment of a process 1100 for programming NAND strings of memory cells. For purposes of this document, the term program and programming are synonymous with write and writing. In one example embodiment, the process of FIG. 16 is performed on integrated memory assembly 104 using the control circuitry 310 discussed above. For example, the process of FIG. 16 can be performed at the direction of state machine 312. In one embodiment, process 1100 is used to program a codeword into memory structure 326. The process of FIG. 16 is performed by control die 104 to program memory cells on the memory die. In one embodiment, the process of FIG. 16 is performed at the direction of state machine 312.

In many implementations, the magnitude of the program pulses is increased with each successive pulse by a predetermined step size. In step 1102 of FIG. 11, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1104 the control die will pre-charge channels of NAND strings that include memory cells connected to the selected word line that are to be inhibited from programming.

In step 1106, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1108, a program pulse of the program signal Vpgm is applied to the selected word line (the word line selected for programming) by the control die. If a memory cell on a NAND string should be programmed, then the corresponding bit line is biased at a program enable voltage, in one embodiment. Herein, such a NAND string is referred to as a "selected NAND string."

In step 1108, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1110, memory cells that have reached their target states are locked out from further programming by the control die. Step 1110 may include performing verifying at one or more verify reference levels. In one embodiment, the verification process is performed by testing whether the threshold voltages of the memory cells selected for programming have reached the appropriate verify reference voltage. In step 1110, a memory cell may be locked out after the memory cell has been verified (by a test of the Vt) that the memory cell has reached its target state.

If, in step 1112, it is determined that all of the memory cells have reached their target threshold voltages (pass), the programming process is complete and successful because all selected memory cells were programmed and verified to their target states. A status of "PASS" is reported in step 1114. Otherwise if, in step 1112, it is determined that not all of the memory cells have reached their target threshold voltages (fail), then the programming process continues to step 1116.

In step 1116, the memory system counts the number of memory cells that have not yet reached their respective target threshold voltage distribution. That is, the system counts the number of memory cells that have, so far, failed to reach their target state. This counting can be done by state machine 312, memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1118, it is determined whether the count from step 1116 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1114. In this situation, enough memory cells programmed correctly such that the few remaining memory cells that have not been completely programmed can be corrected using ECC during the read process. In some embodiments, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1124. If the program counter PC is less than the program limit value PL, then the process continues at step 1122 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1122, the process loops back to step 1104 and another program pulse is applied to the selected word line (by the control die) so that another iteration (steps 1104-1122) of the programming process of FIG. 16 is performed.

Figure 17A:
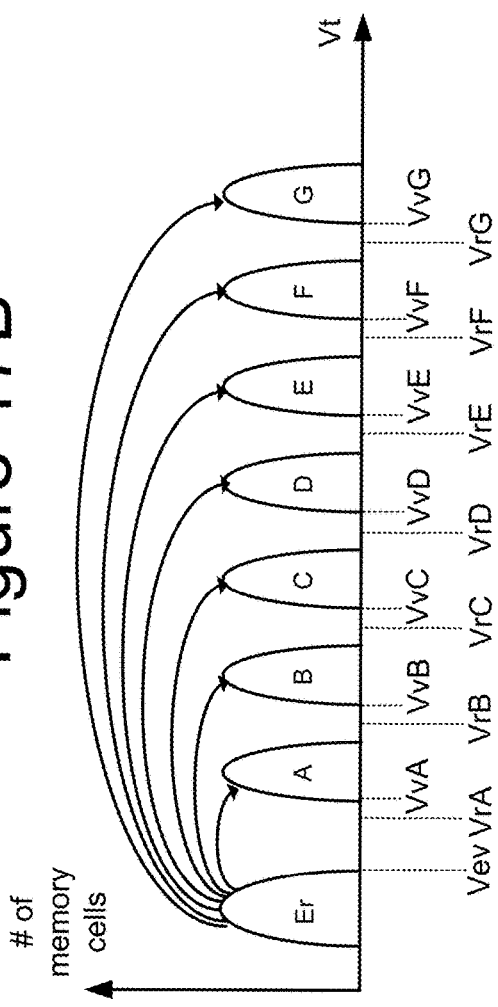
FIG. 17A illustrates example threshold voltage distributions for a population of non-volatile memory cells when each memory cell stores one bit of data.

At the end of a successful programming process, the threshold voltages of the memory cells should be within one or more distributions of threshold voltages for programmed memory cells or within a distribution of threshold voltages for erased memory cells, as appropriate. FIG. 17A is a graph of threshold voltage versus number of memory cells, and illustrates example threshold voltage distributions for the memory array when each memory cell stores single bit per memory cell data. FIG. 17A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store single bit per memory cell data are referred to as single level cells ("SLC").

Figure 17B:
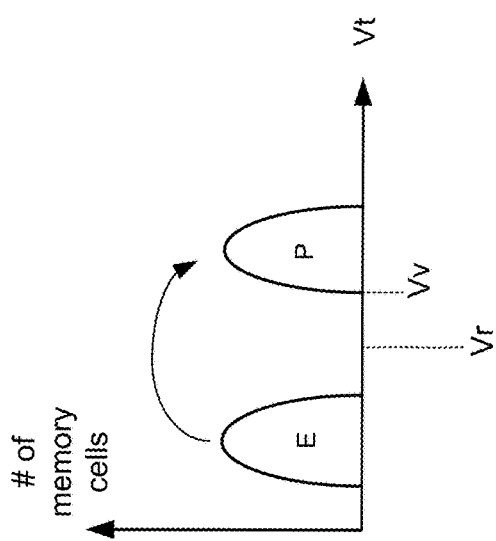
FIG. 17B illustrates example threshold voltage distributions for a population of non-volatile memory cells when each memory cell stores three bits of data.

FIG. 17B illustrates example threshold voltage distributions for the memory array when each memory cell stores multiple bit per memory cell data. Memory cells that store multiple bit per memory cell data are referred to as multi-level cells ("MLC"). In the example embodiment of FIG. 17B, each memory cell stores three bits of data. Other embodiments, however, may use other data capacities per memory cell (e.g., such as one, two, four, or five bits of data per memory cell). FIG. 17b shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 17B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 17B also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 17B also shows Vev, which is a voltage level to test whether a memory cell has been properly erased.

In one embodiment, known as full sequence programming, memory cells can be programmed from the erased data state Er directly to any of the programmed data states A-G using the process of FIG. 16. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 17B represent the full sequence programming. In some embodiments, data states A-G can overlap, with control die 304 and/or memory controller 102 relying on error correction to identify the correct data being stored.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 17) or verify operation (e.g. see verify target levels VvA, VvB, VvC, VvD, VvE, VvF, and VvG of FIG. 17B) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 18:
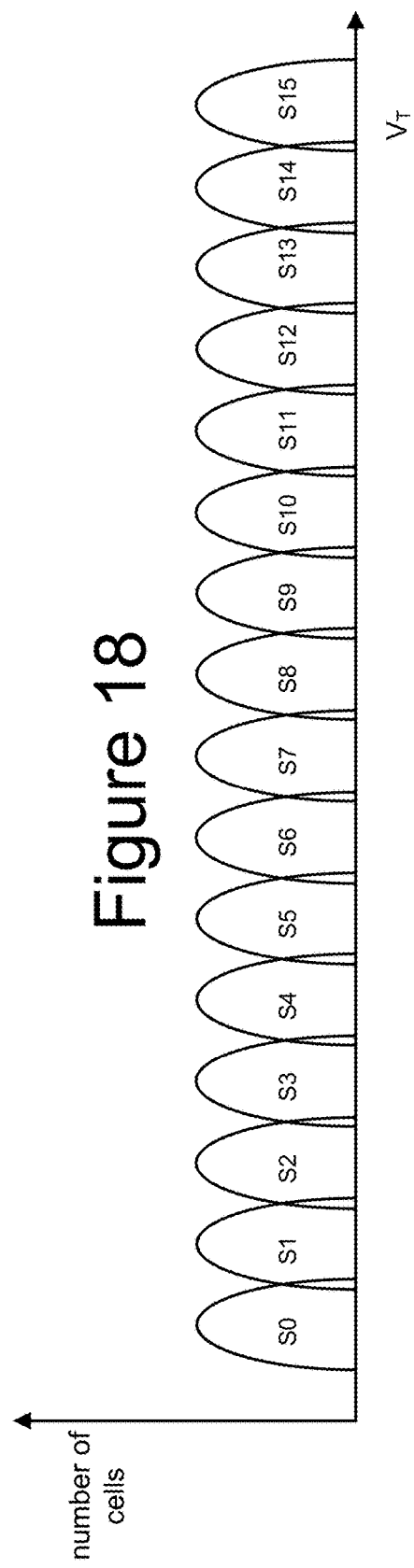
FIG. 18 illustrates example threshold voltage distributions for a population of non-volatile memory cells when each memory cell stores four bits of data.

FIG. 18 depicts threshold voltage distributions when each memory cell stores four bits of data. FIG. 18 depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. When using four bits per memory cell, the memory can be programmed using the full sequence programming discussed above, or multi-pass programming processes.

Figure 19:
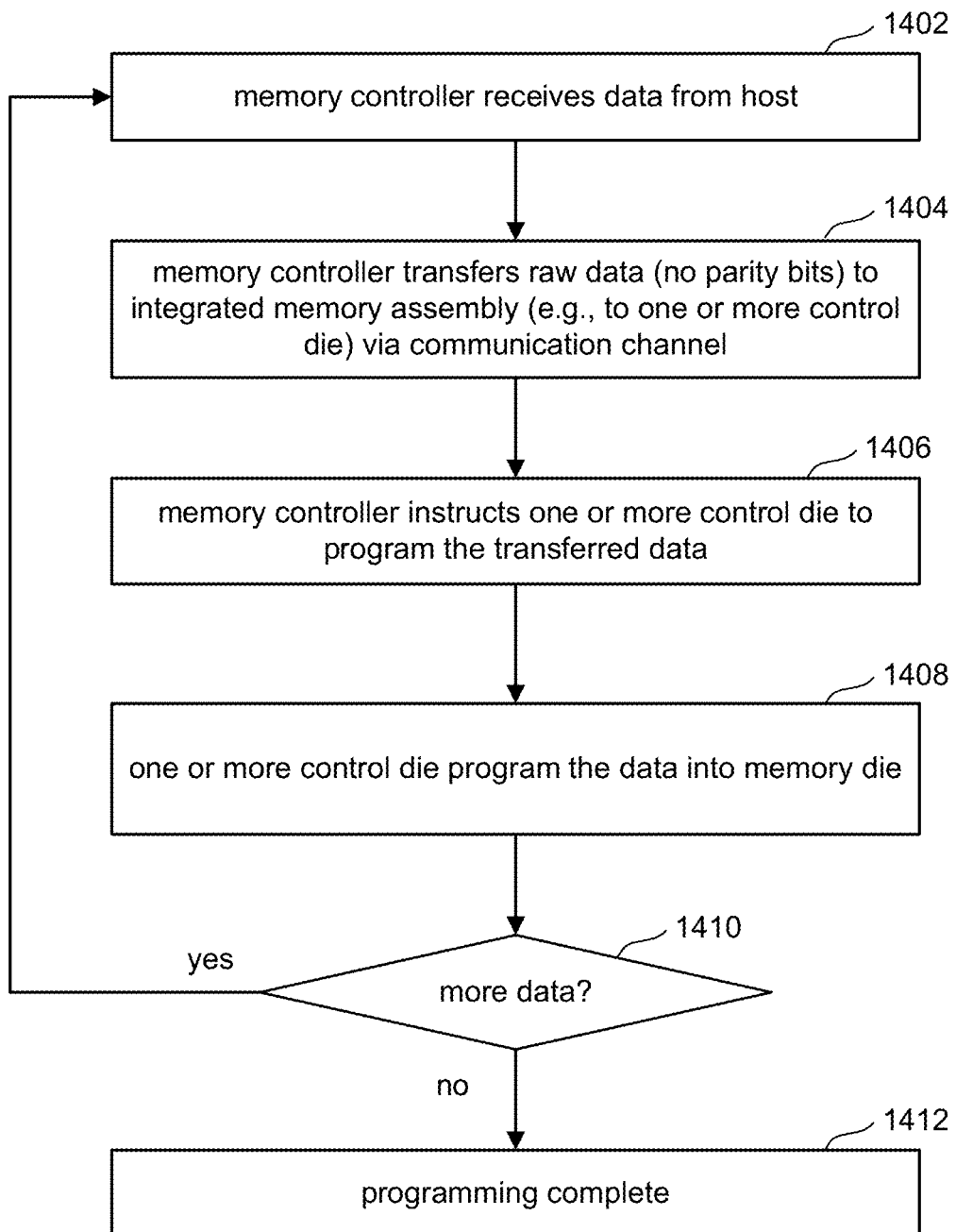
FIG. 19 is a flowchart describing one embodiment of a process for programming a storage system.

FIG. 19 is a flow chart describing one embodiment of a process performed by memory controller 102 to cause data to be programmed into memory cells on memory die 302. In the embodiment of FIG. 19, control die 304 encodes data for ECC purposes, rather than memory controller 102. In step 1402, memory controller 102 receives data from host 120 by way of interface 130 (see FIG. 1). The data can be user data. For purposes of this document, user data is data received from an entity external to the memory system for storage in the memory system. For example, user data may be received from a host, another computing device, a sensor (e.g., a camera), etc. User data is not data preloaded in the memory system or data generated by the memory system. In an example implementation where the memory system is embedded in a digital camera, then user data would include image files captured by the camera. In step 1404 of FIG. 19, memory controller 102 transfers raw data (e.g., user data not encoded with ECC information) to integrated memory assembly 104 (e.g., to one or more control die 304) by way of communication channel (e.g., a Toggle Mode interface). In step 1406, memory controller 102 instructs one or more control die 304 to program the transferred raw data into one or more memory die 302. In one embodiment, the instruction to perform the programming comprises sending one or more addresses and one or more commands by way of the communication channel (e.g., a Toggle Mode Interface—see memory controller interface 332). In some embodiments, step 1408 is performed before step 1406. In step 1408, the one or more control die 304 program the data into one or more memory die 302. If there is more data to be programmed (step 1410), then the process of FIG. 22 loops back to step 1402; otherwise, programming is complete (step 1412).

Figure 20:
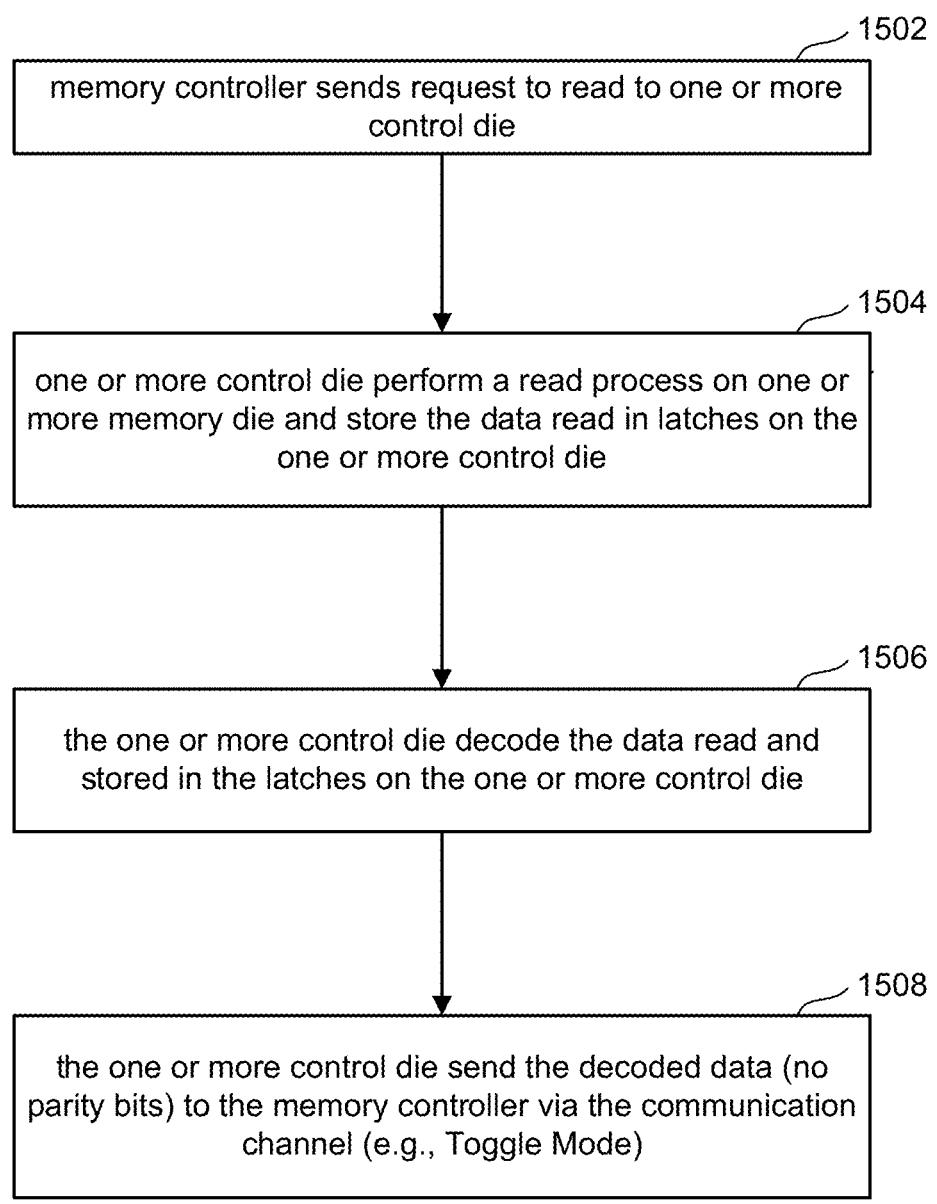
FIG. 20 is a flowchart describing one embodiment of a process for reading data from a storage system.

FIG. 20 is a flow chart describing one embodiment of a process performed by memory controller 102 to cause data to be read from memory cells on memory die 302. In step 1502, memory controller 102 sends a request to read to one or more control die 304. In one embodiment, the instruction to perform the reading comprises sending one or more addresses and one or more commands by way of the communication channel (e.g., a Toggle Mode Interface—see memory controller interface 332). In step 1504, one or more control die 304 perform a read process on one or more memory die 302 and store the data read in latches 360 on the one or more control die 302. In step 1506, the one or more control die 304 (e.g., decoder 390) decode the data read (as discussed above) and stored in the latches 360 on the one or more control die 304. In step 1508, the one or more control die 304 send the decoded data to memory controller 102 by way of the communication channel (e.g., a Toggle Mode Interface—see memory controller interface 332). In one embodiment, the one or more control die 304 send the decoded data bits but not the parity bits to memory controller 102 by way of the communication channel. In another embodiment, the control die sends the data read to the memory controller, and the memory controller decodes the data.

Some storage devices using the technology described above often (but not always) store data in blocks. For example, FIG. 8 shows a memory structure that includes one or more planes (e.g., plane 520) that includes a plurality of blocks (e.g., block 0, block 1, . . . block M−1). In the example of FIG. 8, bit lines run across all of the blocks of plane 530 and each word line runs the width of one block. Other embodiments can have other arrangements. Typically, but not always, the memory cells can only be erased at the block level (e.g., an entire block at a time). As data is overwritten or deleted, the memory system may mark that overwritten or deleted data as invalid or stale. Over time, a block of memory cells may become fragmented such that groups of valid data may be separated by invalid data (e.g., data that was rewritten somewhere else, deleted etc.). This results in inefficient use of space in the memory array. As the amount of data stored in the memory approaches the capacity of the memory, the space wasted for the invalid data between fragments of valid data needs to be reclaimed.

To address the inefficient use of space in the memory array due to fragmented data, a compaction process can be used to compact the valid data and re-write the compacted valid data in a different location, thereby, freeing up the source location to be reclaimed for another use.

A storage system typically includes a memory controller 102 and one or more memory dies separated by a communication interface. If the memory controller 102 performs the data compaction process, then the data must be read from the memory, transferred to the memory controller, compacted, transferred back to the memory and then re-programmed in the memory. This process can be slow and utilize extra power due to transferring the data twice between the memory controller and the memory die. Therefore, it is proposed to implement the memory as multiple dies, including a memory die 302 and a control die 304, as discussed above. The memory die 302 will include the memory array. The control die 304 includes one or more control circuits (e.g., including one or more processors) that can operate the memory die. If the control die 304 performs the data compaction process, then time and power are saved from not transferring the data twice between the memory controller and the memory.

Figure 21:
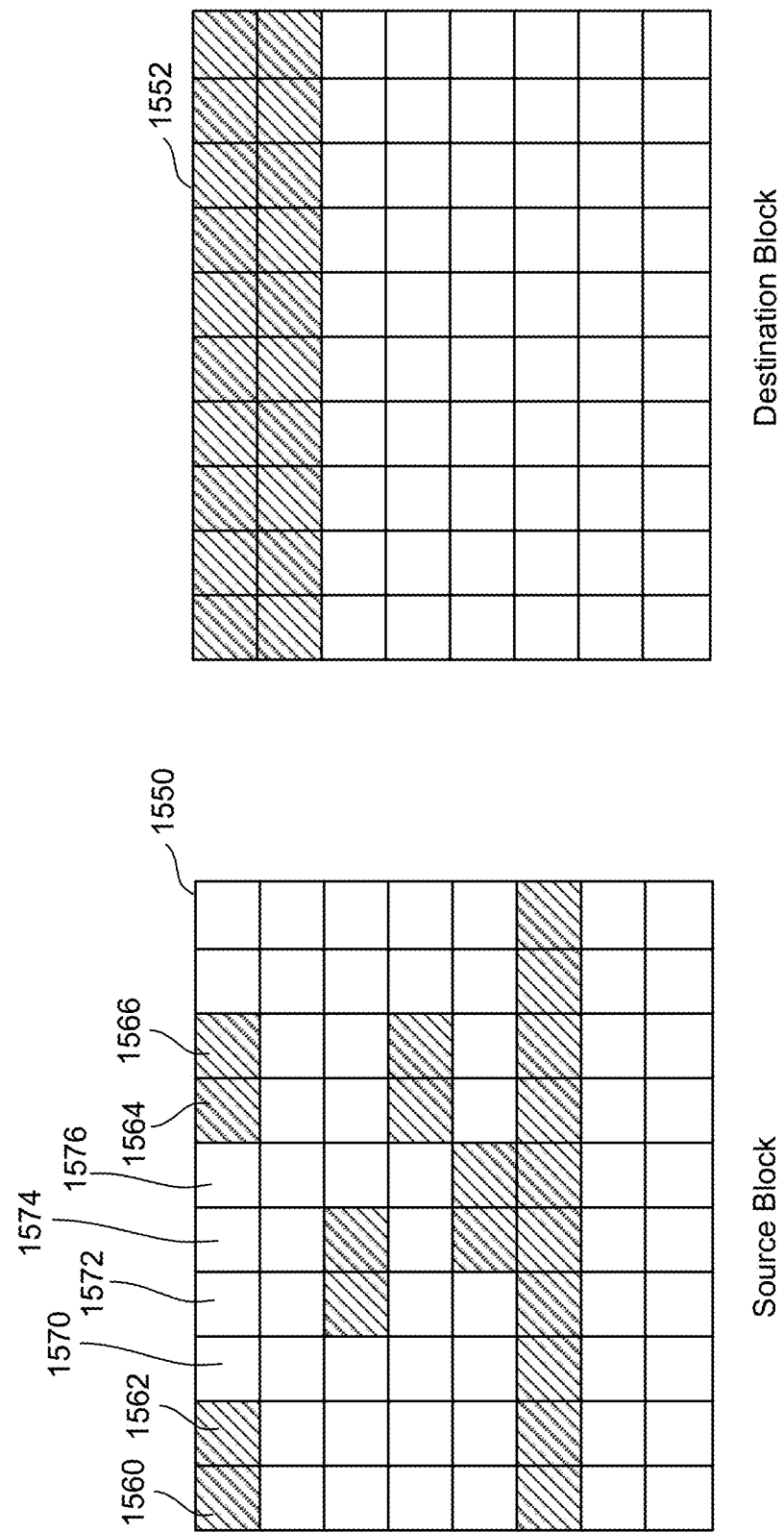
FIG. 21 depicts a data compaction process from a source block to a destination block.

FIG. 21 provides an example of the compaction process that can be performed by the control die 304. FIG. 21 depicts a source block 1550 and a destination block 1552. In one embodiment, source block 1550 and destination block 1552 are each a single physical block on a single memory die 302. A physical block may be divided into pages. In one example, a page is the unit of programming and/or the unit of reading, and a page comprises data in memory cells connected to a same word line. In other examples, different units of programming and reading can be used, and different arrangements of pages can be used. In some embodiments, pages are divided into fragments (also referred flash management units). In some example implementations, a fragment is the unit of programming and/or the unit of reading. In one example implementation, a page is 16K of data and a fragment is 4K of data; however, other amounts can also be implemented. Each fragment represents data stored in memory cells. In another embodiment, source block 1550 and destination block 1552 are each metablocks. For purposes of this document, a metablock is a collection of physical blocks across multiple memory dies (e.g., one physical block on each of a plurality of memory dies). A metablock may be divided into metapages. For purposes of this document, a metapage is a collection of pages across multiple memory dies (e.g., one page in a single block on each of a plurality of memory dies). A metapage exists in a metablock. Metapages comprise a plurality of fragments.

FIG. 21 shows source block 1550 and destination block 1552 divided into fragments. Each of the squares of source block 1550 and destination block 1552 are a fragment. For example, source block 1550 includes fragments 1560, 1562, 1564, 1566, 1570, 1572, 1574, 1576, and other fragments not labeled. Fragments that are shaded represent valid data and fragments that are not shaded represent invalid data. For example, fragments 1560, 1562, 1564, and 1566 store valid data, and fragments 1570, 1572, 1574, and 1576 store invalid data. The valid data stored in source block 1550 is fragmented as there are gaps in the valid data. An example of a gap in the valid data comprises fragments 1570, 1572, 1574, and 1576 (which store invalid data). As depicted in FIG. 21, fragments 1570, 1572, 1574, and 1576 are between fragment 1562 (which stores valid data) and fragment 1564 (which stores valid data). The compaction process will remove this gap.

The compaction process will comprise the control die 304 reading the fragments of source block 1550, compacting the data and storing the compacted data in destination block 1552 (without transferring the data to memory controller 102). FIG. 21 shows the data in destination block 1552 such that there are no gaps in the valid data. Therefore, the data is stored more efficiently and there is more open space in destination block 1552 to store additional data.

Figure 22:
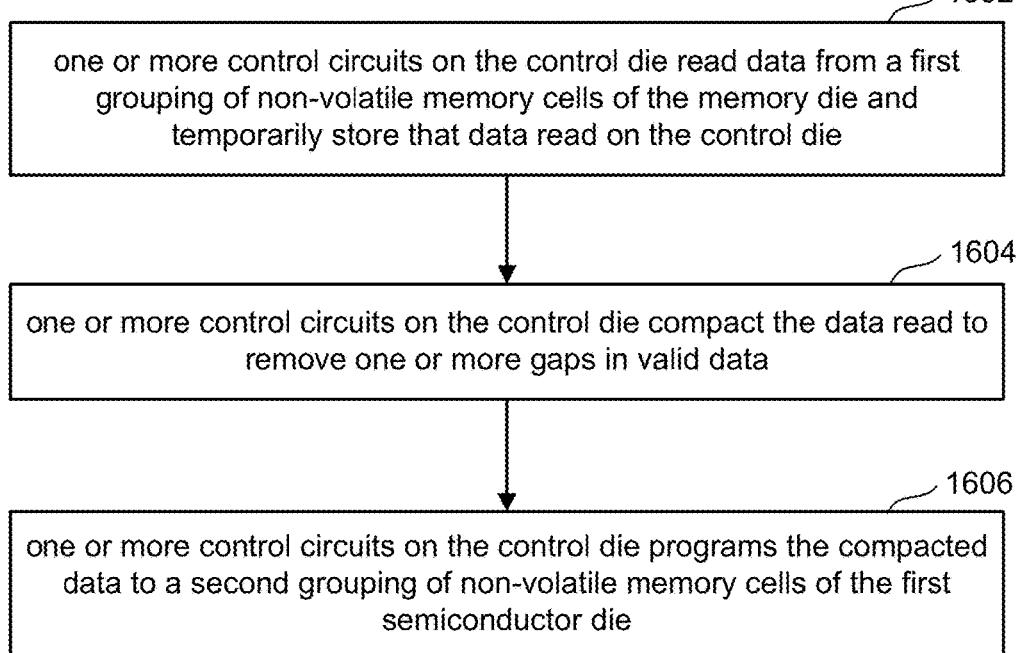
FIG. 22 is a flow chart describing one embodiment of a process for compacting data.

FIG. 22 is a flow chart describing one embodiment of a process for compacting data that is performed by one or more control die 304 (serially or concurrently). In one embodiment, memory controller 102 determines whether a data compaction process should be performed (including determining the source block and, optionally, the destination block), and sending instructions to the control die accordingly. In such an embodiment, the process of FIG. 22 would be performed by one or more control die 304 in response to the instruction(s) from memory controller 102. In one set of embodiments, the process of FIG. 22 is performed by one or more control circuits on control die 304; for example, including data compaction circuit 334 and/or software that programs one or more processors (e.g., microprocessor, microcontroller, RISC processor, etc.) on control die 304.

In step 1602 of FIG. 22, one or more control circuits on a control die 304 read data from a first grouping of non-volatile memory cells of the memory die and temporarily store that data read on the control die. For example, control die 304 reads a page or a set of fragments from source block 1550 (see FIG. 21). After reading, the data read can be stored in storage region 318, latches 360 or in another location on control die 304. In step 1604, one or more control circuits on the control die 304 compact the data read to remove one or more gaps in valid data. For example, control die 304 compacts the data to remove gaps between valid data, as depicted in FIG. 21. Note that an example of valid data is data stored by a user of the storage device. Invalid data may be data that has gone stale, been replaced by a newer version, erased or a location in memory not yet used. In step 1606, one or more control circuits on the control die program the compacted data to a second grouping of non-volatile memory cells of the first semiconductor die. For example, control die 304 programs/writes a page or a set of fragments to destination block 1552 (see FIG. 21).

Figure 23:
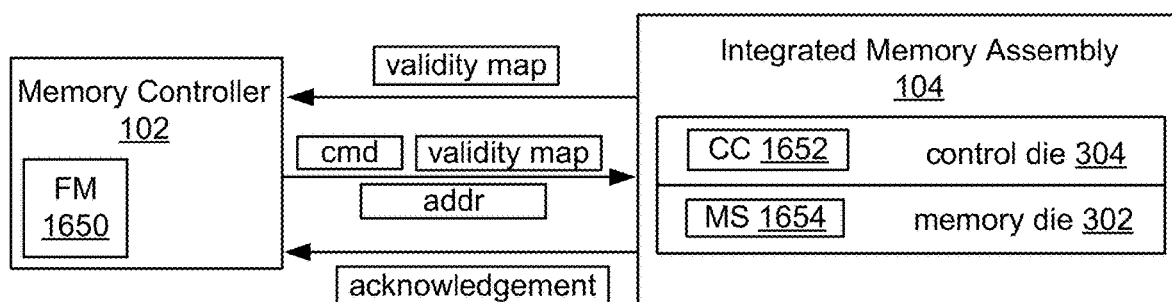
FIG. 23 is a block diagram depicting an example of components that can be used to perform the data compaction process.

FIG. 23 is a block diagram depicting an example of performing one embodiment of the data compaction process of FIG. 22. FIG. 23 shows memory controller 102 in communication with one or more integrated memory assemblies 104. In one example, each integrated memory assembly 104 includes a memory die 302 bonded to a control die 304. Some embodiments can include multiple memory dies connected to a control die. Control die 304 includes the one or more control circuits 1652 mentioned above. Memory die 302 includes a memory structure 1654, as described above.

Memory structure 1654 includes the memory cells referred to in FIG. 22. In the embodiment of FIG. 23, memory controller 102 receives a validity map from integrated memory assembly 104. The validity map is stored in memory structure 1654, read by one or more control circuits 1652 and transferred to memory controller 102 by control die 304. In one embodiment, the validity map includes a set of data for every physical block and/or every metablock. The set of data for a block or metablock comprises an identification of each fragment and a flag indicating whether that fragment is valid data or invalid data. Flash management module 1650 (software, an electrical circuit, or a combination of both), uses the validity map to determine whether a block needs to be compacted. Flash management module 1650 may periodically perform this analysis when the storage system 100 is idle or in response to determining that the storage system is approaching a state of having not enough free space to store new data. In response to determining that a source block needs to be compacted to free up space, memory controller 102 sends a command to the control die 304 to perform the compaction process. That command may include addresses for the source block and the destination block. Memory controller 102 also sends the validity map to the control die. In one embodiment, the memory controller only sends the validity map for the source block. In response to the command from the memory controller 102, the control die 304 performs the compaction process based on the validity map and sends an acknowledgement back to the memory controller 102. The control die 304 performs the compaction process without transferring the valid data to the memory controller 102.

Figure 24:
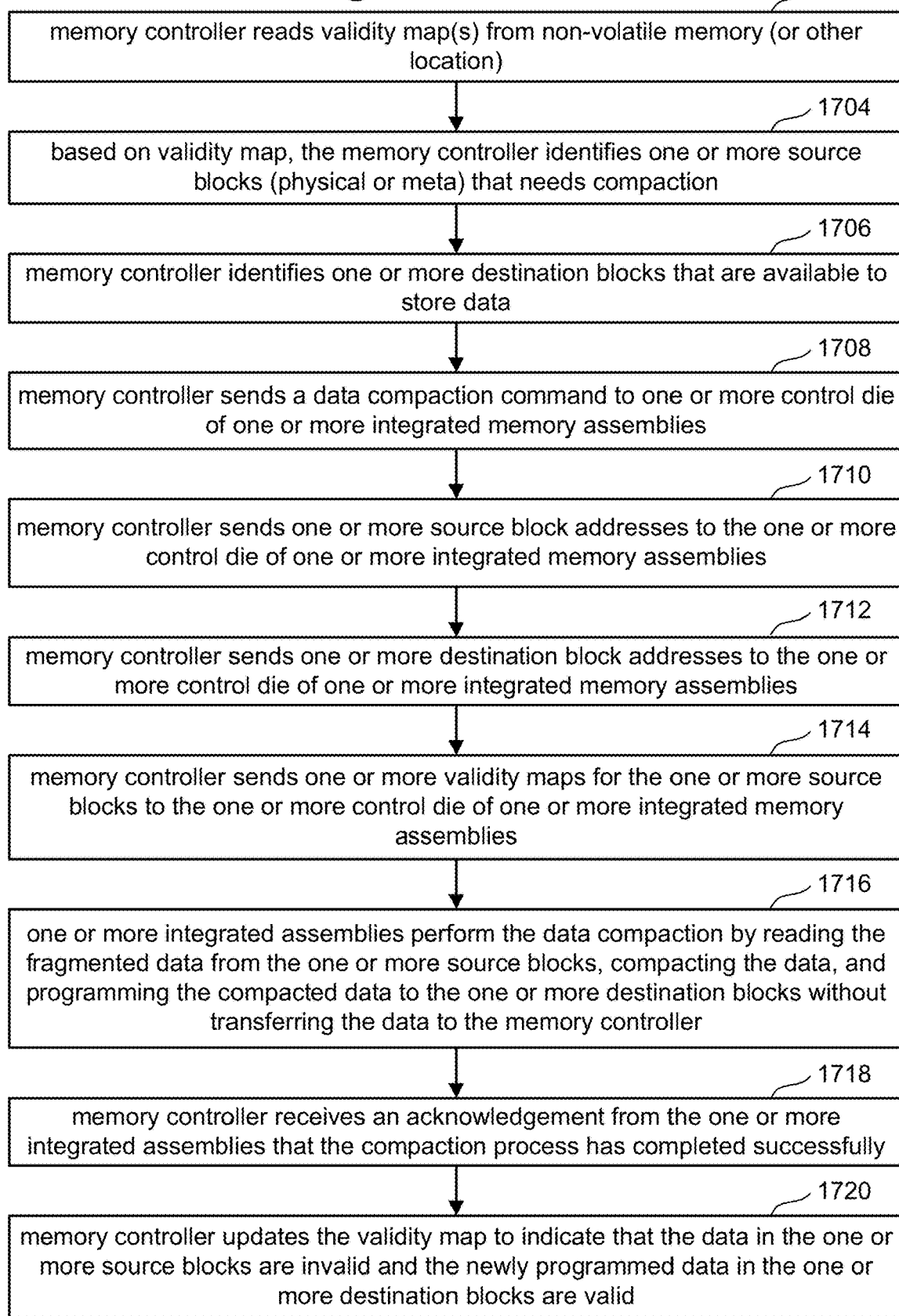
FIG. 24 is a flow chart describing one embodiment of a process for performing data compaction.

FIG. 24 is a flow chart describing one embodiment of a process for performing data compaction. The process of FIG. 24 represents one example of a more detailed implementation of the process of FIG. 22. In some embodiments, the process of FIG. 24 is performed by the components depicted in FIG. 23, in the background when the storage system is idle.

In step 1702 of FIG. 24, memory controller 102 reads validity map(s) from non-volatile memory cells (or other location) on memory die 302. In step 1704, based on validity map read, memory controller 102 identifies one or more source blocks (physical or meta) that need data compaction. In step 1706, memory controller 102 identifies one or more destination blocks that are available to store data. In step 1708, memory controller 102 sends a data compaction command to one or more control die of one or more integrated memory assemblies 104. In step 1710, memory controller 102 sends one or more source block addresses to the one or more control die 304 of one or more integrated memory assemblies 104. In step 1712, memory controller sends one or more destination block addresses to the one or more control die 304 of one or more integrated memory assemblies 104. In step 1714, memory controller 102 sends one or more validity maps for the one or more source blocks to the one or more control die 304 of one or more integrated memory assemblies 104. In another embodiment, instead of sending the validity bitmap, memory controller 102 sends the location of the validity map (in memory 326) to the control die 304, and control die 304 can fetch the validity map from the location of the validity bitmap by itself and do the processing. In step 1716, the one or more integrated assemblies 104 (e.g., control die 304) perform the data compaction by reading the fragmented data from the one or more source blocks, compacting the data, and programming the compacted data to the one or more destination blocks without transferring the data to memory controller 102. In step 1718, memory controller 102 receives an acknowledgement from the one or more integrated assemblies 104 that the compaction process has completed successfully. In step 1720, memory controller 102 updates the validity map to indicate that the data in the one or more source blocks are invalid and the newly programmed data in the one or more destination blocks are valid. The one or more source blocks can now be reclaimed for another use; for example, they can be erased and used to store new data.

Figure 25A:
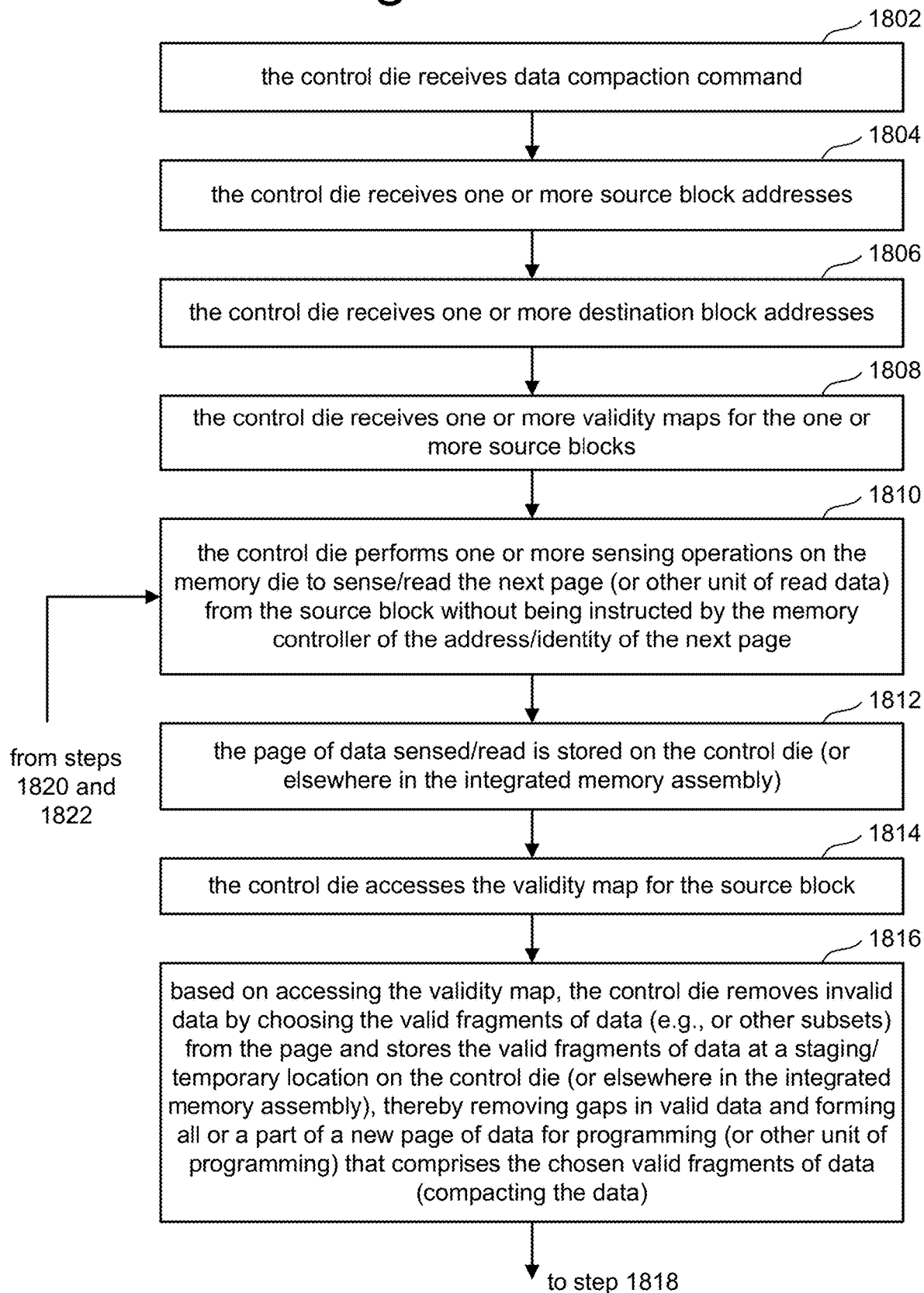
FIGS. 25A and 25B together are a flow chart describing one embodiment of a process performed by a control die of an integrated memory assembly to implement a data compaction process.
Figure 25B:
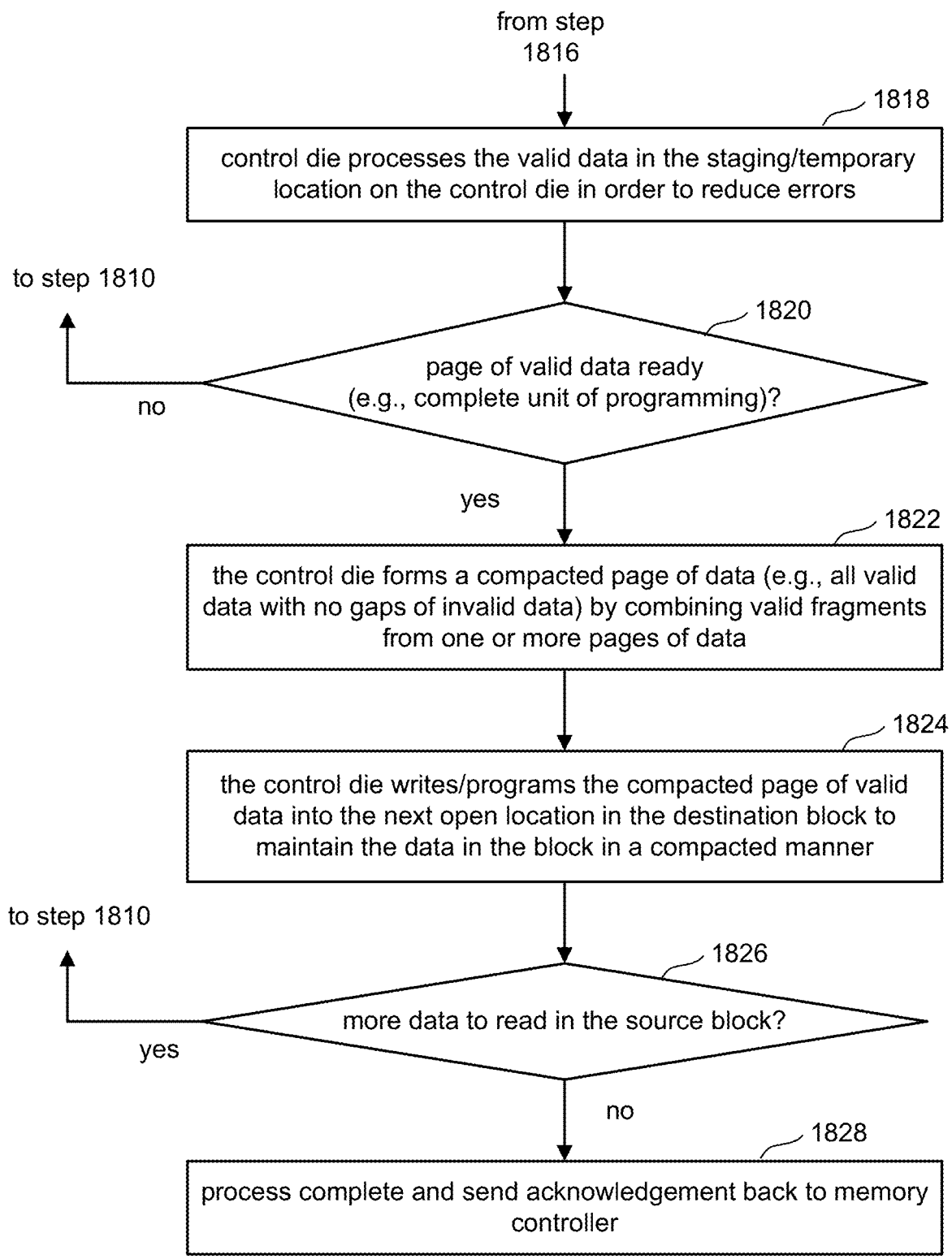

FIGS. 25A and 25B together are a flow chart describing one embodiment of a process performed by a control die 304 of an integrated memory assembly 104 to implement a data compaction process. The process of FIGS. 25A and 25B represents one example implementation of step 1716 of FIG. 24. The process of FIGS. 25A and 25B also represents one example implementation of steps 1602-1606 of FIG. 22. In one example, the process of FIGS. 25A and 25B are performed by one or more control circuits 1652 of control die 304.

In step 1802, control die 304 receives data compaction command from memory controller 102. In step 1804, control die 304 receives one or more source block addresses from memory controller 102. In step 1806, control die 304 receives one or more destination block addresses from memory controller 102. In step 1808, control die 304 receives one or more validity maps for the one or more source blocks from memory controller 102. In step 1810, control die 304 performs one or more sensing operations on the memory die to sense/read the next page (or other unit of read data) from the source block without being instructed by the memory controller of the address/identity of the next page. In an alternative embodiment, control die 304 can skip pages with no valid data as per the validity map. In step 1812, the page of data sensed/read is stored on the control die (or elsewhere in the integrated memory assembly). For example, the data read can be stored in storage region 318, latches 360 or in another location on control die 304. In step 1814, control die 304 accesses the validity map for the source block. In step 1816, based on accessing the validity map, control die 304 removes invalid data from the data read by choosing the valid fragments of data (e.g., or other subsets) from the page read and storing the valid fragments at a staging/temporary location on the control die (or elsewhere in the integrated memory assembly), thereby removing gaps in valid data and forming all or a part of a new page of data for programming (or other unit of programming) that comprises the chosen valid fragments (compacting the data). The staging/temporary location on the control die can include storage region 318, latches 360 or in another location on control die 304. In step 1818, control die 304 processes the valid data in the staging/temporary location on the control die in order to reduce errors. More details of step 1818 are described below with respect to FIG. 26. Step 1818 is optional as some embodiments do not include step 1818.

In step 1820, it is determined whether there is a page of valid data ready to be programmed (e.g., is there a complete unit of programming in the staging/temporary location on the control die)? If there is a page of valid data ready to be programmed, then in step 1822, control die 304 forms a compacted page of data (e.g., all valid data with no gaps of invalid data) by combining valid fragments (or accessing the already combined valid fragments) from one or more pages of data from the source block. In step 1824, the control die 304 writes/programs the compacted page of valid data into the next open location in the destination block to maintain the data in the block in a compacted manner. In step 1826, it is determined whether there is more data to read in the source block? If not, process is complete and control die 304 sends an acknowledgement back to memory controller 102 in step 1828. If there is more data to read in the source block, then the process loops back to step 1810 to read the next page of data (or other amount of data) from the source block.

If, in step 1820, it was determined that there is not a page of valid data ready to be programmed (e.g., there is not a complete unit of programming in the staging/temporary location on the control die), then the process loops back to step 1810 to read the next page of data (or other amount of data) from the source block. Valid data from the next page will be combined with the valid data from the current page to form a compacted page of valid data to be stored in the destination block. In this manner, control die 304 performs one or more sensing operations to read a first page of data (including multiple fragments); chooses valid fragments from the first page of read data based on the validity map and stores the chosen valid fragments on the control die; if the chosen valid fragments from the first page of data is a complete unit of programming, then store the unit of programming in the destination block; and if the chosen valid fragments from the first page of data is a not complete unit of programming, then the control die 304 performs one or more sensing operations on the to read a second page of data from the source block, chooses one or more valid fragments from the second page of read data based on the validity map and combines the chosen one or more valid fragments from the second page of data with the chosen valid fragments from the first page of data to from a complete unit of programming for storing in the destination block.

Figure 26:
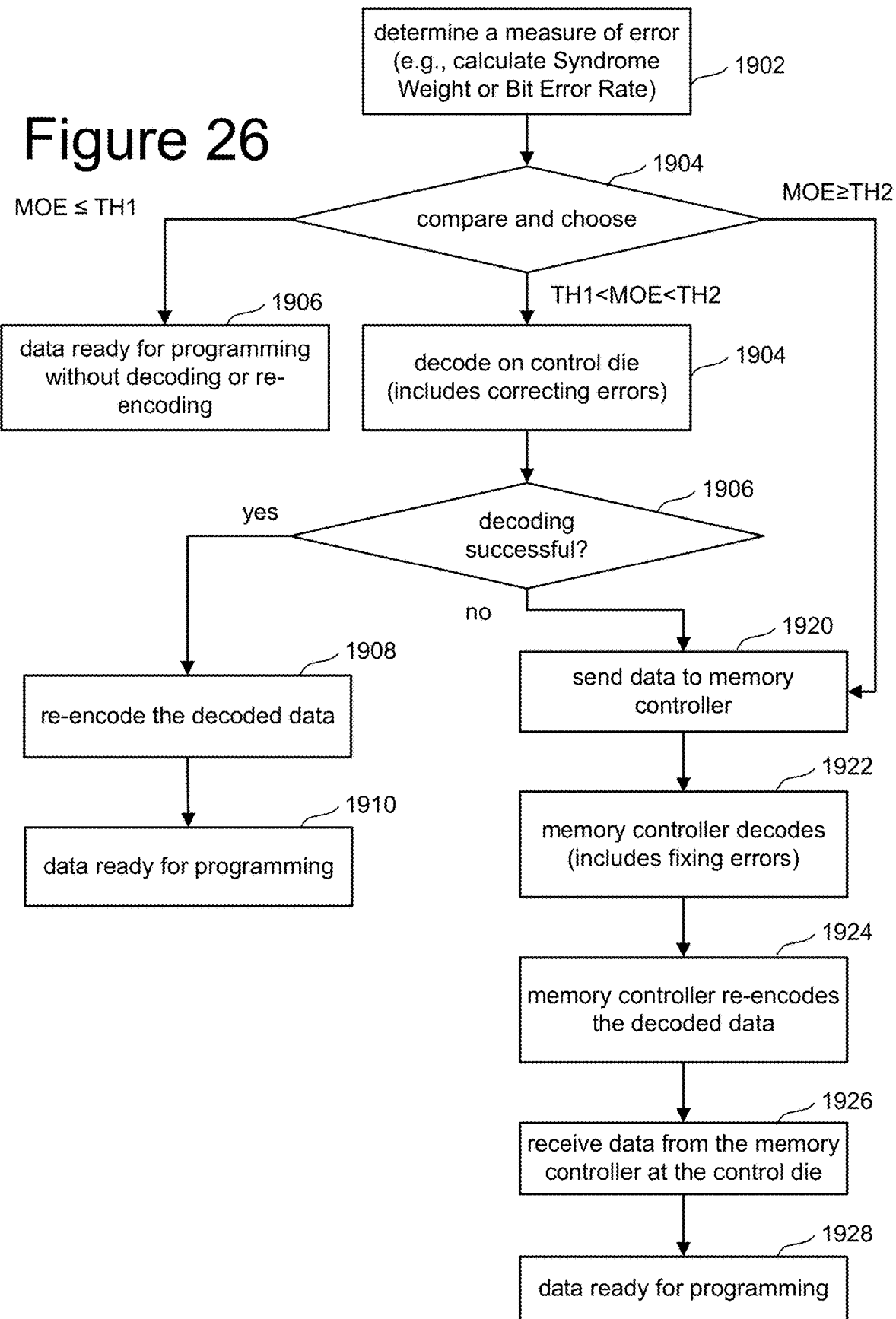
FIG. 26 is a flow chart describing one embodiment of a process for reducing errors in data being compacted.

FIG. 26 is a flow chart describing one embodiment of a process for reducing errors in data being compacted. The process of FIG. 26 is one example implementation of step 1818 of FIG. 25B. In one embodiment, the process of FIG. 26 is performed by one or more control circuits 1652 of control die 304.

In step 1902 of FIG. 26, control die 304 determines a measure of error for the set of data. In one embodiment, the one or more control circuits of control die 304 are configured to determine the measure of error for the set of data without decoding the set of data. In one embodiment, determining a measure of data can comprise determining a syndrome weight, which does not require decoding the data. For example, the one or more control circuits of control die 304 can determine a number of parity checks equations that are unsatisfied. In another embodiment, determining a measure of data can comprise determining a bit error rate (BER) of the set of data. Other measures of error can also be used. In one embodiment, step 1902 is performed on/by control die 304 for the data read in step 1810. Step 1902 can be performed on all data read or only the data that is indicated by the validity map to be valid.

In step 1904, control die 304 compares the measure of error (MOE) determined in step 1902 to two thresholds, threshold 1 (TH1) and threshold 2 (TH2), and chooses a course of action based on the comparison If the measure of error (MOE) is less than or equal to threshold 1 (TH1), then the data is ready for programming as is, without decoding the data and/or re-encoding the decoded data (step 1906). The data is still being stored on the control die 304. If the measure of error (MOE) is greater than threshold 1 (TH1) and less than threshold 2 (TH2), then control die 304 decodes the data (as discussed above) on the control die (including fixing errors) (step 1904). The decoding process is performed on control die 304 by decoder 390 while the data is stored in latches 360 or storage region 318. If the decoding of step 1904 is successful (step 1906), then in step 1908 control die 304 re-encodes the decoded data (as discussed above). The encoding process is performed on control die 304 by encoder 380 while the data is stored in latches 360 or storage region 318. After encoding, the data is ready for programming (step 1910).

If (in step 1904) it is determined that the measure of error (MOE) is greater than or equal to threshold 2 (TH2) or the decoding process of step 1904 is not successful (step 1906), then the data is transmitted from control die 304 to memory controller 102 by way of the communication channel (e.g., a Toggle Mode Interface—see memory controller interface 332). As discussed above, in one embodiment memory controller 102 has a stronger decoder (e.g., higher resolution that can fix more errors at higher power) than control die 304. In step 1922, memory controller 102 decodes the data while the data is stored on the memory controller. The decoding process includes fixing errors in the data. In step 1926, control die 304 receives the data back from memory controller 102. After receiving the data and storing it in latches 360 or storage region 318, the data is ready for programming (step 1928). Steps 1904-1928 are an example embodiment of choosing between and causing (based on the determined measure of error): no decoding of the set of data; performing decoding of the set of data on the control die 304; or performing decoding of the set of data at a memory controller. In one example embodiment where the measure of error is the syndrome weight, threshold 1 (TH1) is in the range of 20-30 and threshold 2 (TH2) is in the range of 200-400 (e.g., 300).

An integrated memory assembly is disclosed that comprises a memory die and a control die bonded to the memory die. The memory die includes a memory structure of non-volatile memory cells. The control die is configured to program user data to and read user data from the memory die in response to commands from a memory controller. To utilize space more efficiently on the memory die, the control die compacts fragmented data on the memory die. Performing the data compaction using the control die, rather than the memory controller, saves time and power as the data being compacted need not be transferred twice between the memory structure and the memory controller.

One embodiment includes an apparatus comprising a first semiconductor die that includes non-volatile memory cells and a first plurality of pathways; and a second semiconductor die that includes one or more control circuits. The second semiconductor die further comprises an interface to an off die circuit and a second plurality of pathways directly connected to the first plurality of pathways. The second semiconductor die is directly bonded to the first semiconductor die. The one or more control circuits are configured to transfer signals through pathway pairs of the first plurality of pathways and the second plurality of pathways. The one or more control circuits are configured to read data from a first grouping of non-volatile memory cells of the first semiconductor die, compact the data read to remove one or more gaps in valid data, and program the compacted data to a second grouping of non-volatile memory cells of the first semiconductor die.

In one example implementation (see e.g., FIG. 25A/B), the one or more control circuits are further configured to access a validity map for the first grouping of non-volatile memory cells of the first semiconductor die. The validity map indicates which subsets of data stored in the first grouping of non-volatile memory cells are valid and which subsets of data stored in the first grouping of non-volatile memory cells are invalid. The one or more control circuits are configured to read data from the first grouping of non-volatile memory cells and compact the data read by performing one or more sensing operations on the first grouping of non-volatile memory cells to read a first unit of read data, the first unit of read data includes multiple fragments, choosing valid fragments from the first unit of read data based on the validity map and storing the chosen valid fragments on the second semiconductor die, if the chosen valid fragments from the first unit of read data complete a unit of programming, then storing the unit of programming that includes the chosen valid fragments from the first unit of read data in the second grouping of non-volatile memory cells of the first semiconductor die, and if the chosen valid fragments do not complete the unit of programming, then performing one or more sensing operations on the first grouping of non-volatile memory cells to read a second unit of data, choosing one or more valid fragments from the second unit of read data based on the validity map and combining the chosen one or more valid fragments from the second unit of read data with the chosen valid fragments from the first unit of read data to from a complete unit of programming and storing the complete unit of programming in the second grouping of non-volatile memory cells of the first semiconductor die.

In one example implementation (see e.g., FIG. 25A/B), the one or more control circuits are further configured to access a validity map for the first grouping of non-volatile memory cells of the first semiconductor die, the validity map indicates which fragments of data stored in the first grouping of non-volatile memory cells are valid and which fragments of data stored in the first grouping of non-volatile memory cells are invalid; the one or more control circuits are configured to read data from the first grouping of non-volatile memory cells by reading one or more pages of data from a source block; the one or more control circuits are further configured to choose valid fragments of the one or more pages of data read based on the validity map; the one or more control circuits are configured to compact the data read by removing invalid fragments and forming a new page of data that comprises the chosen valid fragments of the data read; and the one or more control circuits are configured to store the compacted data by programming the new page of data to a destination block on the first semiconductor die.

In one example implementation, the one or more control circuits are further configured to receive a data compaction command from a memory controller that is external to and separate from the first semiconductor die and the second semiconductor die; the one or more control circuits are further configured to perform the reading of the data from the first grouping of non-volatile memory cells, compacting the data read and storing the compacted data in response to the data compaction command; and the one or more control circuits are further configured to perform the reading of the data from the first grouping of non-volatile memory cells, compacting the data read and storing the compacted data without transferring the data read to the memory controller.

In one example implementation, the one or more control circuits are configured to read data from the first grouping of non-volatile memory cells of the first semiconductor die via the pathway pairs of the first plurality of pathways and the second plurality of pathways; and the one or more control circuits are configured to store the compacted data by programming the compacted data via the pathway pairs of the first plurality of pathways and the second plurality of pathways.

One embodiment includes a method comprising: a control die that is bonded to a memory die receives a data compaction command, a source block address, a destination block address and a validity map from a memory controller via a communication pathway between the control die and the memory controller, the memory die comprises non-volatile memory cells; the control die performing a sensing operation on the memory die to sense a first set of data from the source block without being instructed by the memory controller of the address of the first set of data; based on the validity map, the control die choosing valid fragments of the first set of data and storing the chosen valid fragments of the first set of data on the control die; the control die performing a sensing operation on the memory die to sense a second set of data from the source block without being instructed by the memory controller of the address of the second set of data; based on the validity map, the control die choosing valid fragments of the second set of data and storing the chosen valid fragments of the second set of data on the control die; the control die combining one or more of the valid fragments of the first set of data and one or more of the valid fragments of the second set of data to form a compacted set of data; and the control die programming the compacted set of data to a destination block corresponding to the destination block address.

One example implementation includes the control die determining a measure of error for the valid fragments of the first set of data, the control die combining one or more of the valid fragments of the first set of data and one or more of the valid fragments of the second set of data to form the compacted set of data and programming the compacted set of data without decoding and re-encoding the valid fragments of the first set of data if the measure of error is less than a first threshold; and the control die decoding the valid fragments of the first set of data to reduce errors in the valid fragments of the first set of data and re-encoding the valid fragments of the first set of data prior to the combining if the measure of error is greater than the first threshold.

One embodiment includes an apparatus comprising a memory controller and an integrated memory assembly separate from and in communication with the memory controller. The integrated memory assembly comprises a memory die that includes a three dimensional memory structure of non-volatile memory cells and a control die bonded to the memory die. The control die has a first interface for communicating with the memory controller and a second interface for communicating with the memory die, the second interface is wider than the first interface. The memory controller is configured to send a compaction command, indication of a source block of non-volatile memory cells on the memory die and a validity map to the integrated assembly, the validity map indicates which fragments of the source block are valid. The control die is configured to read pages of data from the source block in response to the compaction command, choose valid data from the data read based on the validity map, assemble the chosen valid data to form a page of data that does not contain gaps in the valid data, and program that page of data into a destination block of non-volatile memory cells on the memory die without transferring the valid data to the memory controller.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., by way of one or more other parts). In some cases, when an element is referred to as being connected or coupled to another element, the element may be directly connected to the other element or indirectly connected to the other element by way of intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

For purposed of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the disclosed technology and its practical application, to thereby enable others skilled in the art to best utilize it in various embodiments and with various modifications as are suited to the particular use contemplated. It is intended that the scope be defined by the claims appended hereto.

We claim:

1. An apparatus, comprising:
a first semiconductor die comprising non-volatile memory cells and a first plurality of pathways; and
a second semiconductor die comprising one or more control circuits, the second semiconductor die further comprises an interface to an off die circuit and a second plurality of pathways directly connected to the first plurality of pathways, the second semiconductor die is directly bonded to the first semiconductor die, the one or more control circuits are configured to transfer signals through pathway pairs of the first plurality of pathways and the second plurality of pathways, the one or more control circuits are configured to:
read data from a first grouping of non-volatile memory cells of the first semiconductor die,
compact the data read to remove one or more gaps in valid data, and
program the compacted data to a second grouping of non-volatile memory cells of the first semiconductor die.

2. The apparatus of claim 1, wherein:
the one or more control circuits are further configured to access a validity map for the first grouping of non-volatile memory cells of the first semiconductor die, the validity map indicates which subsets of data stored in the first grouping of non-volatile memory cells are valid and which subsets of data stored in the first grouping of non-volatile memory cells are invalid;
the one or more control circuits are further configured to choose valid subsets of the data read based on the validity map; and
the one or more control circuits are configured to compact the data read by removing invalid data and forming a unit of programming that comprises the chosen valid subsets of the data read.

3. The apparatus of claim 2, wherein:
the one or more control circuits are further configured to store the compacted data by programming the unit of programming into the next open location in the second grouping of non-volatile memory cells.

4. The apparatus of claim 2, wherein:
the one or more control circuits are further configured to decode the chosen valid subsets of the data to reduce errors in the chosen valid subsets of the data; and
the one or more control circuits are configured to re-encode the chosen valid subsets of the data prior to storing on the first semiconductor die.

5. The apparatus of claim 2, wherein:
the one or more control circuits are further configured to determine a measure of error for the chosen valid subsets of the data;
the one or more control circuits are configured to store the unit of programming that comprises the chosen valid subsets of the data read without decoding and re-encoding the chosen valid subsets of the data if the measure of error is less than a first threshold; and
the one or more control circuits are configured to decode the chosen valid subsets of the data to reduce errors in the chosen valid subsets of the data and re-encode the chosen valid subsets of the data prior to storing on the unit of programming that comprises the chosen valid subsets of the data if the measure of error is greater than the first threshold.

6. The apparatus of claim 5, wherein:
the one or more control circuits are configured to transfer chosen valid subsets of the data to a memory controller for decoding if the measure of error is greater than a second threshold that is higher than the first threshold.

7. The apparatus of claim 5, wherein:
the measure of error is syndrome weight.

8. The apparatus of claim 2, wherein: the one or more control circuits are further configured to receive a data compaction command and the validity map from a memory controller that is external to and separate from the first semiconductor die and the second semiconductor die; and the one or more control circuits are further configured to perform the reading of the data from the first grouping of non-volatile memory cells, compacting the data read and storing the compacted data in response to the data compaction command.

9. The apparatus of claim 1, wherein:
the one or more control circuits are further configured to access a validity map for the first grouping of non-volatile memory cells of the first semiconductor die, the validity map indicates which subsets of data stored in the first grouping of non-volatile memory cells are valid and which subsets of data stored in the first grouping of non-volatile memory cells are invalid; and
the one or more control circuits are configured to read data from the first grouping of non-volatile memory cells and compact the data read by:
performing one or more sensing operations on the first grouping of non-volatile memory cells to read a first unit of read data, the first unit of read data includes multiple fragments,
choosing valid fragments from the first unit of read data based on the validity map and storing the chosen valid fragments on the second semiconductor die, if the chosen valid fragments from the first unit of read data complete a unit of programming, then storing the unit of programming that includes the chosen valid fragments from the first unit of read data in the second grouping of non-volatile memory cells of the first semiconductor die, and if the chosen valid fragments do not complete the unit of programming, then performing one or more sensing operations on the first grouping of non-volatile memory cells to read a second unit of data, choosing one or more valid fragments from the second unit of read data based on the validity map and combining the chosen one or more valid fragments from the second unit of read data with the chosen valid fragments from the first unit of read data to from a complete unit of programming and storing the complete unit of programming in the second grouping of non-volatile memory cells of the first semiconductor die.

10. The apparatus of claim 1, wherein:

the one or more control circuits are further configured to access a validity map for the first grouping of non-volatile memory cells of the first semiconductor die, the validity map indicates which fragments of data stored in the first grouping of non-volatile memory cells are valid and which fragments of data stored in the first grouping of non-volatile memory cells are invalid;

the one or more control circuits are configured to read data from the first grouping of non-volatile memory cells by reading one or more pages of data from a source block;

the one or more control circuits are further configured to choose valid fragments of the one or more pages of data read based on the validity map;

the one or more control circuits are configured to compact the data read by removing invalid fragments and forming a new page of data that comprises the chosen valid fragments of the data read; and the one or more control circuits are configured to store the compacted data by programming the new page of data to a destination block on the first semiconductor die.

11. The apparatus of claim 1, wherein:

the one or more control circuits are further configured to receive a data compaction command from a memory controller that is external to and separate from the first semiconductor die and the second semiconductor die;

the one or more control circuits are further configured to perform the reading of the data from the first grouping of non-volatile memory cells, compacting the data read and storing the compacted data in response to the data compaction command; and the one or more control circuits are further configured to perform the reading of the data from the first grouping of non-volatile memory cells, compacting the data read and storing the compacted data without transferring the data read to the memory controller.

12. The apparatus of claim 11, wherein:

the one or more control circuits are further configured to receive a data compaction command and an indication of a location in the non-volatile memory cells of a validity map from a memory controller that is external to and separate from the first semiconductor die and the second semiconductor die;

the one or more control circuits are further configured to fetch the validity map from the location in the non-volatile memory cells, the validity map indicates which subsets of data stored in the first grouping of non-volatile memory cells are valid and which subsets of data stored in the first grouping of non-volatile memory cells are invalid;

the one or more control circuits are further configured to choose valid subsets of the data read based on the validity map; and the one or more control circuits are configured to compact the data read by removing invalid data and forming a unit of programming that comprises the chosen valid subsets of the data read.

13. The apparatus of claim 1, wherein:

the one or more control circuits are configured to read data from the first grouping of non-volatile memory cells of the first semiconductor die via the pathway pairs of the first plurality of pathways and the second plurality of pathways; and the one or more control circuits are configured to store the compacted data by programming the compacted data via the pathway pairs of the first plurality of pathways and the second plurality of pathways.

14. The apparatus of claim 1, wherein:

the second semiconductor die includes sense amplifiers for reading data from the non-volatile memory cells on the first semiconductor die.

15. The apparatus of claim 14, wherein:

the non-volatile memory cells on the first semiconductor die are arranged in a memory array;

the memory array includes word lines;

the second semiconductor die includes address decoders for the memory array; and the second semiconductor die includes signal generators configured to generate voltages applied to the word lines of the memory array.

* * * * *